(12) United States Patent
Joffe et al.

(10) Patent No.: US 6,170,046 B1
(45) Date of Patent: Jan. 2, 2001

(54) ACCESSING A MEMORY SYSTEM VIA A DATA OR ADDRESS BUS THAT PROVIDES ACCESS TO MORE THAN ONE PART

(75) Inventors: Alexander Joffe, Palo Alto; Ari Birger, Sunnyvale, both of CA (US)

(73) Assignee: MMC Networks, Inc., Sunnyvale, CA (US)

( * ) Notice: Under 35 U.S.C. 154(b), the term of this patent shall be extended for 0 days.

(21) Appl. No.: 08/959,636

(22) Filed: Oct. 28, 1997

(51) Int. Cl.[7] .................................................. G06F 12/02
(52) U.S. Cl. ...................... 711/169; 711/148; 711/149; 711/150; 711/168
(58) Field of Search ........................... 711/148, 150, 711/157, 167, 168, 169, 149, 147, 104; 709/213, 214; 710/21

(56) References Cited

U.S. PATENT DOCUMENTS

| | | |
|---|---|---|
| 4,744,078 | 5/1988 | Kowalczyk . |
| 4,750,154 | 6/1988 | Lefsky et al. . |
| 4,754,451 | 6/1988 | Eng et al. . |
| 4,760,570 | * 7/1988 | Acampora et al. . |
| 4,888,741 | 12/1989 | Malinowski . |
| 4,891,794 | 1/1990 | Hush et al. . |
| 4,891,795 | 1/1990 | Pinkham et al. . |
| 5,142,638 | 8/1992 | Schiffleger . |
| 5,204,841 | 4/1993 | Chappell et al. . |
| 5,278,967 | 1/1994 | Curran . |
| 5,337,287 | 8/1994 | Nishikawa . |
| 5,432,907 | * 7/1995 | Picazo, Jr. et al. ................... 395/200 |
| 5,440,523 | * 8/1995 | Joffe ................................. 365/230.05 |

(List continued on next page.)

FOREIGN PATENT DOCUMENTS

| | | |
|---|---|---|
| 0187518 | 7/1986 | (EP) . |
| 0201174A2 | 12/1986 | (EP) .............................. G06F 12/06 |
| 5-151769 | 6/1993 | (JP) . |
| WO 95/05635 | 2/1995 | (WO) . |
| WO 97/06489 | 2/1997 | (WO) . |

OTHER PUBLICATIONS

"ATMS2000 Application Note; Support For More Than 32K Connections" (MMC Networks, Inc., document 95–0009). 1995.*
ATMS2000 User's Guide (MMC Networks, Inc., issue 1.1) Jan. 1996.*
ATMS2004B Switch Controller 2 'GRAY' (MMC Networks, Inc., document 95–0004); 1995.*
ATMS2003B Switch Controller 1 'WHITE' (MMC Networks, Inc., document 95–0003); 1995.*

* cited by examiner

Primary Examiner—Do Hyun Yoo
Assistant Examiner—Gary J. Portka
(74) Attorney, Agent, or Firm—Skjerven Morrill MacPherson LLP; Michael Shenker

(57) ABSTRACT

In a memory system, each data bus is connected to memories connected to different address buses. Each memory allows pipelined read operations such that when data are being read out from a memory in one read operation, the address can be provided to the memory for another read. However, write operations are not pipelined, and the write address and write data are provided to the memory simultaneously. Nevertheless, consecutive reads can overlap with writes. Each write operation uses address and data buses not taken by any read occurring in parallel with the write. The address and data buses are connected to the memories so that no data bus penalty occurs when a memory is switched from a read to a write or from a write to a read. In some embodiments, multiple memories are subdivided into sets of mirror-image memories. In each set, all the memories store the same data. When simultaneous read accesses are desired to read data stored in one of the memories, the read accesses can be performed instead to different memories that are mirror images of each other. When any memory is written, all the memories of the same set are written with the same data.

26 Claims, 18 Drawing Sheets

U.S. PATENT DOCUMENTS

| | | | | |
|---|---|---|---|---|
| 5,490,263 | * | 2/1996 | Hashemi | 711/149 |
| 5,634,004 | | 5/1997 | Gopinath et al. . | |
| 5,651,129 | * | 7/1997 | Yokote et al. | 711/104 |
| 5,856,940 | | 1/1999 | Rao | 365/149 |
| 5,875,470 | * | 2/1999 | Dreibelbis et al. | 711/147 |
| 5,907,864 | * | 5/1999 | Potts et al. | 711/169 |
| 5,920,898 | * | 7/1999 | Bolyn et al. | 711/167 |
| 5,923,593 | | 7/1999 | Hsu et al. | 365/189.04 |
| 5,925,118 | * | 7/1999 | Revilla et al. | 710/110 |

| CLK | 1 | 2 | 3 | 4 | 5 | | |
|---|---|---|---|---|---|---|---|
| mAddr_U | Rd1 | Rd2 | Wr3 | Rd4 | Wr5 | | |
| mAddr_D |  | Wr2 | Rd3 | Wr4 | Rd5 | | |
| Data_L |  | Rd1 | Wr3 | Wr4 | Rd4 | Rd5 | |
| Data_R |  | Wr2 | Rd2 | Rd3 | Wr5 | | |
| L_we |  | 0 | 1 | 1 | 0 | | |
| R_we |  | 1 | 0 | 0 | 1 | | |
| L_oe | 1 | 0 | 0 | 1 | 1 | | |
| R_oe |  | 1 | 1 | 0 | 0 | | |
| UL_cs | 1 | 0 | 1 | 1 | 0 | | |
| UR_cs |  | 1 | 0 | 0 | 1 | | |
| DL_cs | 0 | 0 | 0 | 1 | 1 | | |
| DR_cs |  | 1 | 1 | 0 | 0 | | |
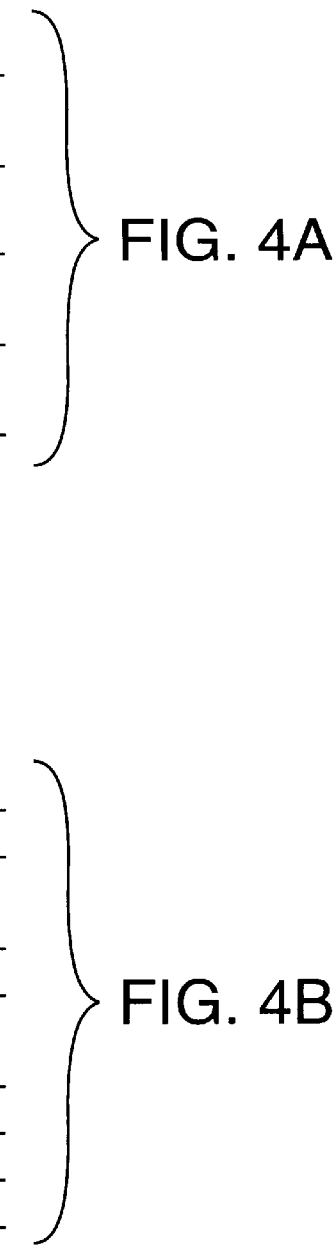
FIG. 4A
FIG. 4B
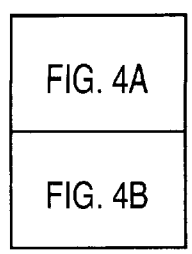
FIG. 4

ACCESSING A MEMORY SYSTEM VIA A DATA OR ADDRESS BUS THAT PROVIDES ACCESS TO MORE THAN ONE PART

BACKGROUND OF THE INVENTION

The present invention relates to memories, systems using memories, and methods for accessing memories.

To increase throughput of memory access operations, some data processing systems employ multi-ported memories. Multiple access operations are allowed to proceed in parallel through different ports to increase the throughput. However, the cost of memories increases with the number of ports. Therefore, it is desirable to use memories having fewer ports while still obtaining high throughput. Further, in memory systems with multi-ported memories, separate address and data buses are used for each port. It is desirable to reduce the number of address and data buses in the memory system.

It is also desirable to increase the address and data bus utilization in memories that use different timing for read and write operations. Such memories include fast synchronous SRAMs (static random access memories). Different timing for read and write operations causes address or data bus utilization penalty when the memory is switched from a write operation to a read operation or from a read to a write. It is desirable to reduce or eliminate such penalty.

It is also desirable to provide memory systems that enable one to obtain a non-blocking ATM (asynchronous transfer mode) switch, or some other switch, by combining two or more switch fabrics to increase the number of ports but without increasing the cost per port.

SUMMARY

Some embodiments of the present invention provide memory systems that allow multiple access operations to proceed in parallel. Some embodiments use memories with different timing for read and write operations. In particular, in some embodiments, each memory in the memory system allows pipelined read access such that when data are being read out of the memory in one read operation, a read address is provided to the memory for another read operation. However, in a write operation, the address and data are provided to the memory at the same time. (Some fast synchronous SRAMs have such timing.) Therefore, when the memory is switched from a write to a read or from a read to a write, there is utilization penalty with respect to memory address or data ports. However, in some embodiments of the invention, no penalty occurs with respect to the data buses of the memory system. In some embodiments, no penalty occurs also with respect to the address buses. Further, the number of ports in each individual memory is reduced. In some embodiments, each memory is single-ported. The number of data buses is also reduced by making the data buses shared between different ports. In some embodiments, the number of address buses is also reduced by making them shared.

These advantages are achieved in some embodiments by connecting an address bus to different address ports corresponding to data ports connected to different data buses, and/or connecting a data bus to different data ports corresponding to address ports connected to different address buses. In some embodiments, each combination of an address bus and a data bus can be used to access a separate memory.

For example, FIG. 1 shows four single-ported memories 110_UL, 110_UR, 110_DL, 110_DR (FIG. 1). Address bus mAddr_U is connected to the address ports of memories 110_UR and 110_UL, and address bus mAddr_D is connected to the address ports of memories 110_DR and 110_DL. Data bus Data_L is connected to the data ports of memories 110_UL and 110_DL, and data bus Data_R is connected to the data ports of memories 110_UR and 110_DR.

Each combination of an address bus and a data bus allows access to one of the four memories 110.

The memory system is a shared memory in any flow switch, for example, an ATM (Asynchronous Transfer Mode) switch composed of two switch fabrics. The two address buses and the two data buses allow a write and a read to proceed in parallel. In each clock cycle, an ATM cell is written by one of the switch fabrics into one of the memories 110 for storage before transmission, and another cell is read by the other fabric from another one of the memories for transmission. A cell can be written into any memory available for a write operation. Each switch fabric has the same number of ports. Hence, when the switch fabrics are combined, the number of ports is doubled. However, the cost per port is about the same as in a single switch fabric.

Each memory is a synchronous SRAM allowing pipelined reads. A read operation latency is two clock cycles, with one cycle for the address and one cycle for the data. A write operation latency is one cycle. However, both of the address buses and both of the data buses can be used in every cycle. The bus utilization penalty is avoided as follows.

In each clock cycle, one address bus and one data bus can be taken by read operations. (More particularly, in each clock cycle, one address bus can carry an address for a read operation started in this cycle, and one data bus can carry data for a read operation started in the previous cycle). Therefore, in each clock cycle, one address bus and one data bus remain available for a write operation. No utilization penalty occurs.

The invention is not limited to two address buses or two data buses, or to four memories, or to any particular number of clock cycles needed for a read or a write.

Some embodiments provide mirror-image memories that duplicate each other. Some such embodiments allow multiple reads to occur in parallel. Thus, some embodiments are used in an ATM switch in which two reads and two writes can proceed in parallel. If two cells to be read out simultaneously are stored in the same memory, they are also stored in the mirror-image of that memory, and hence each cell can be read out from a different memory. Therefore, the two cells can be read out simultaneously even if each memory is single-ported.

When a cell is written into any memory, it is also written into the mirror image of that memory.

Some embodiments provide more than one mirror images for each memory. For example, in some embodiments, a switch can read four cells simultaneously, and each memory has three mirror image memories such that all the four memories store the same data. Each memory is single-ported. If more than one cells to be read out simultaneously are stored in the same memory, these cells are read out from different memories that are mirror images of each other. Alternatively, in some embodiments each memory has only one mirror image, but each memory is double-ported, and hence four cells stored in the same memory can be read out from the memory and its mirror image simultaneously.

In some mirror-image embodiments, no memory allows pipelined read or write operations, for example, each memory is an asynchronous SRAM. Other embodiments allow pipelined reads or writes or both.

The invention allows a non-blocking ATM switch performing multiple accesses to a shared memory in parallel to be easily constructed from switch fabrics each of which performs at most one shared-memory access at any given time.

The invention is not limited to ATM switches or to networks.

Other features and advantages of the invention are described below. The invention is defined by the appended claims.

BRIEF DESCRIPTION OF THE DRAWINGS

FIG. 4 comprising FIGS. 4A and 4B, is a timing diagram illustrating read and write operations in some embodiments of FIG. 1.

DESCRIPTION OF PREFERRED EMBODIMENTS

Figure 1:
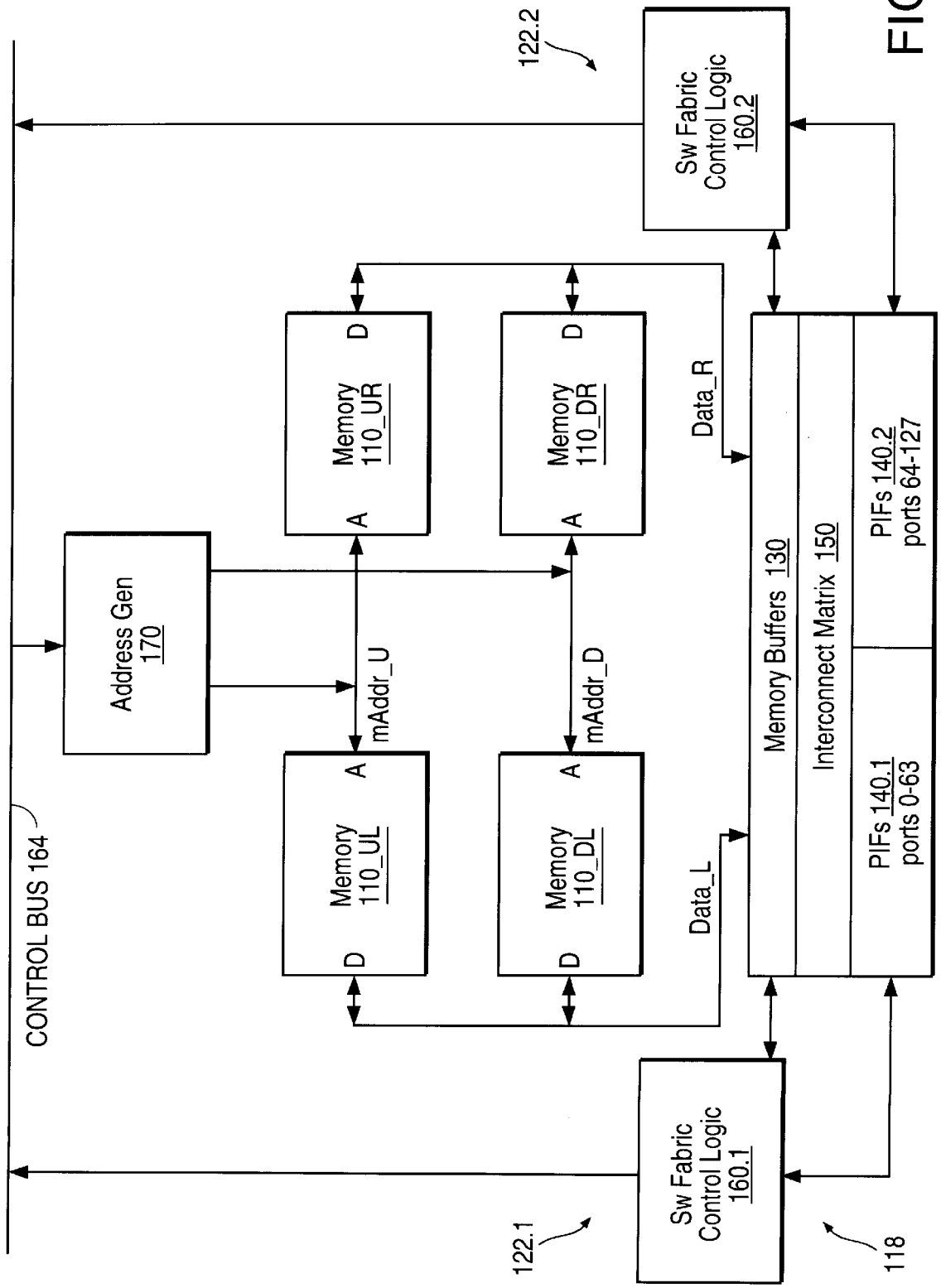
FIG. 1 is a block diagram of an ATM switch having a memory system according to the present invention.

FIG. 1 illustrates a high performance memory system including memory 110_UL ("UL" stands for "upper left", corresponding to the memory position in FIG. 1), memory 110_DL ("down left", or lower left), memory 110_UR ("upper right") and memory 110_DR ("down right", or lower right). These four memories 110 are single-ported. The four memories 110 share two address buses mAddr_U, mAddr_D and two data busses Data_L, Data_R. Address bus mAddr_U is connected to the address inputs of memories 110_UL and 110_UR. Address bus mAddr_D is connected to the address inputs of memories 110_DL and 110_DR. Data bus Data_L is connected to the data ports of memories 110_UL and 110_DL. Data bus Data_R is connected to the data ports of memories 110_UR and 110_DR.

Every combination of an address bus and a data bus can be used to access one of the four memories. For example, address bus mAddr_U and data bus Data_L provide access to memory 110_UL; address bus mAddr_D and data bus Data_R provide access to memory 110_DR. Since there are two address buses and two data buses, two memory accesses can proceed at the same time. In particular, a read and a write can proceed at the same time. Further, as explained below, because the memory system includes four memories, a read from any one of the four memories and a write to another one of the four memories can be performed every clock cycle even if the four memories use a different number of cycles for read and write operations.

Memories 110 form a shared memory system in ATM switch 118. Switch 118 is built from two switch fabrics 122.1, 122.2, and has twice the bandwidth and the number of ports of a single switch fabric. Each switch fabric 122 contains 64 ports (ports 0–63 in switch fabric 122.1, ports 64–127 in switch fabric 122.2). Switch 118 is non-blocking—a cell received on any one of ports 0–127 can be transmitted to any one or more of ports 0–127.

Figure 2A:
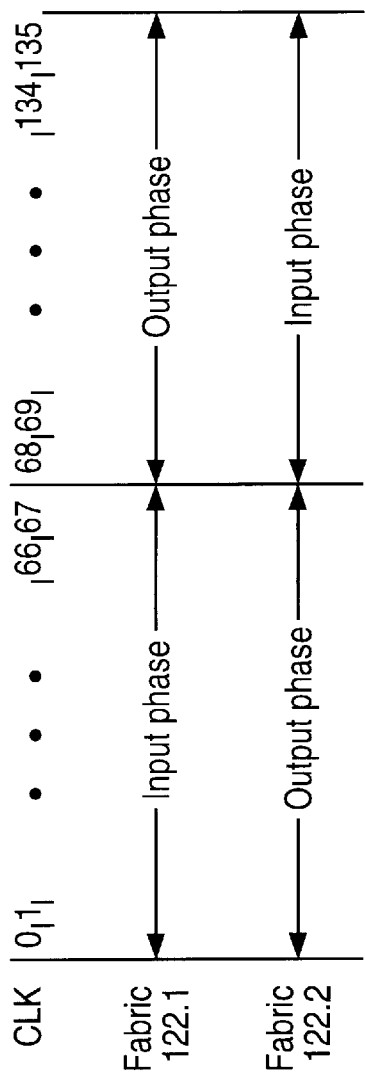
FIGS. 2A, 2B, and 2C are timing diagrams illustrating a switch cycle in some embodiments of FIG. 1.

FIG. 2A illustrates a switch cycle of switch 118. The switch cycle includes clock cycles 0–135. The clock cycle numbers appear on top. Clock cycles 0–67 are the input phase of switch fabric 122.1 and the output phase of switch fabric 122.2. Clock cycles 68–135 are the output phase of switch fabric 122.1 and the input phase of switch fabric 122.2. In its input phase, the switch fabric reads ATM cell payloads from memories 110 to memory buffers 130 (the cell headers are stored in a different memory, not shown). In its output phase, the switch fabric writes cell payloads from buffers 130 to memories 110. Input and output phases of a switch fabric are described in U.S. Pat. No. 5,440,523 issued Aug. 8, 1995, and incorporated herein by reference, and PCT Publication No. WO 97/06489 published Feb. 20, 1997, and incorporated herein by reference.

Figure 2B:
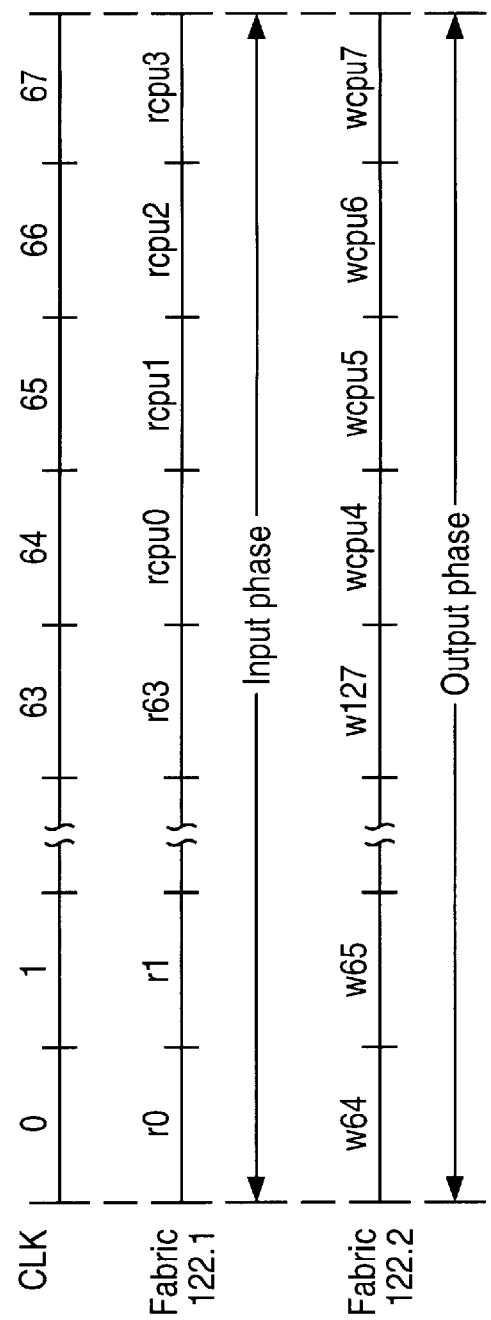

Operation during clock cycles 0–67 is illustrated in more detail in FIG. 2B. Cycles 68–135 are illustrated in more detail in FIG. 2C.

In clock cycle 0 (FIG. 2B), switch fabric 122.1 reads from one of memories 110 a cell payload to be transmitted on port 0, as indicated by "r0". In the same cycle, switch fabric 122.2 writes to another memory 110 a cell payload received on port 64, as indicated by "w64". Similarly, in clock cycle 1, a cell payload is read out for port 1 ("r1"), and a cell payload received on port 65 is written ("w65"). By the end of cycle 63, sixty-four cells (i.e. cell payloads) have been read out for ports 0–63, and the cells received on ports 64–127 have been written.

Switch fabric 122.1 includes four CPUs cpu0–cpu3 (not shown). Switch fabric 122.2 includes four CPUs cpu4–cpu7 (not shown). In cycles 64–67, switch fabric 122.1 reads from memories 110 four cells for transmission to respective CPUs cpu0–cpu3, and switch fabric 122.2 writes to memories 110 four cells received from respective CPUs cpu4–cpu7.

In cycles 68–135 (FIG. 2C), switch fabric 122.1 writes cells received from ports 0–63 and CPUs cpu0–cpu3 to memories 110. In the same cycles, switch fabric 122.2 reads cells to be transmitted to ports 64–127 and CPUs cpu4–cpu7.

A cell received by the switch can be written to any memory 110 for temporary storage before transmission. However, when the cell is to be transmitted, the cell has to be read from the memory in which it was stored. Therefore, for each clock cycle the switch 118 decides which of the four memories 110 has to be read during the clock cycle (the memory to be read is the memory storing the cell to be transmitted). Then the switch selects a different memory 110 to be written in the same clock cycle.

Figure 3:
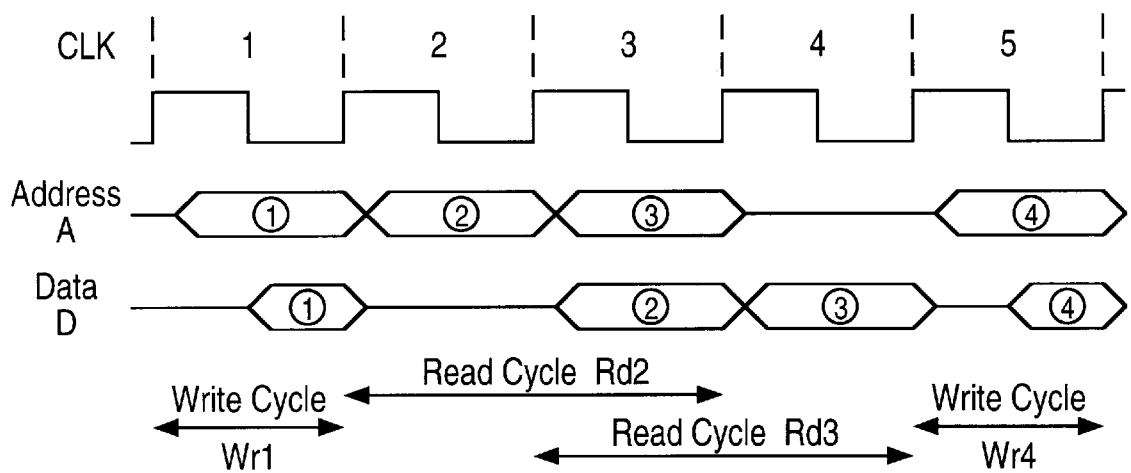
FIG. 3 is a timing diagram of a synchronous SRAM used in some embodiments of FIG. 1.

In some embodiments, memories 110 are synchronous SRAMs in which a read operation takes a different number of clock cycles from a write operation. Synchronous SRAMs have the advantage of being fast. Further, the read operations are pipelined. However, differences between the read and write operation timing lead to a memory bus utilization penalty as illustrated in FIG. 3. In FIG. 3, a read operation takes two clock cycles and a write operation takes one clock cycle. In clock cycle 1 in FIG. 3, a write operation Wr1 is performed. The address is written to the address inputs A of the memory, and the data is written to the data port D. Then a read operation Rd2 is performed in cycles 2 and 3, and another read operation Rd3 is performed in cycles 3 and 4. More particularly, in cycle 2, the Rd2 address is supplied to the address inputs. In cycle 3, the Rd2 data are read out to the data port and the Rd3 address is supplied on the address inputs. In cycle 4, the Rd3 data are read out to the data port. In cycle 5, another write Wr4 is performed. The memory of FIG. 3 is part number MT 58LC64K36/B3 or MT 58LC128K18/B3 or MT 58LC64K18/B3 manufactured by Micron Corporation of Idaho. The memory is used in flow-through mode.

In FIG. 3, switching from a read operation to a write operation or from a write to a read involves a one-cycle penalty. With respect to the data port, the one-cycle penalty is seen between the write operation Wr1 and the read operation Rd2. With respect to the address inputs, the penalty is seen between the read operation Rd2 and the write operation Wr4.

The memory system of FIG. 1 avoids this penalty while using only two address buses and only two data buses. See the timing diagram of FIG. 4 and, in particular, the portion FIG. 4A of FIG. 4. In FIG. 4A, "Rdi" (i=1,2,3,4,5) indicates a read operation started in clock cycle i, and "Wri" indicates a write operation performed in cycle i. Successive reads from the same or different memories are pipelined. More particularly, while data from one read operation are provided on a data bus Data_L or Data_R, an address for another read operation is provided on address bus mAddr_U or mAddr_D. Hence, the read operations take one address bus and one data bus in every clock cycle. For example, in cycle 2, read operations Rd2 and Rd1 take address bus mAddr_U and data bus Data_L. Therefore, the remaining address bus and the remaining data bus are available for a write. Thus, in cycle 2, address bus mAddr_D and data bus Data_R are used by write operation Wr2.

Figure 2C:
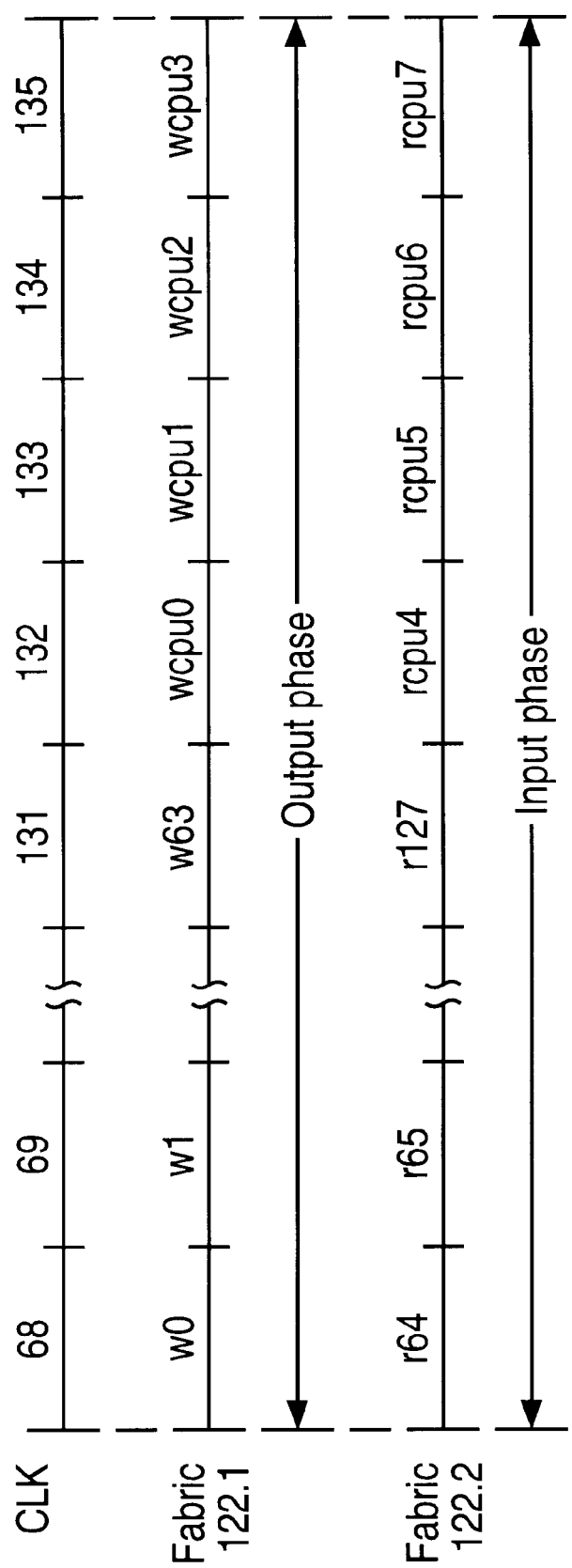

In some embodiments of FIGS. 2B, 2C, "ri" (i=0, 1, . . . 127) or "rcpui" (i=0, 1, . . . 7) indicates a cycle in which a read address is provided on an address bus to read a cell to be transmitted respectively to port i or CPU cpui. In other embodiments, "ri" or "rcpui" indicates a cycle in which a cell to be transmitted to port i or CPU cpui is read out to a data bus.

The use of memories 110 in ATM switch 118 will now be described in more detail. As shown in FIG. 1, the switch includes port interface units (PIFs) 140.1 for ports 0–63 and PIFs 140.2 for ports 64–127. Interconnect matrix 150 connects PIFs 140 to memory buffers 130, as described in U.S. Pat. No. 5,440,523 issued to A. Joffe on Aug. 8, 1995 and incorporated herein by reference, and in PCT publication WO 97/06489 published Feb. 20, 1997 and incorporated herein by reference. In switch fabric 122.1, switch fabric control logic 160.1 controls PIFs 140.1 and memory buffers 130. In identical switch fabric 122.2, switch fabric control logic 160.2 controls PIFs 140.2 and memory buffers 130. In addition, switch fabrics 122.1, 122.2 include cell queuing and scheduling logic which is not shown in FIG. 1. Such logic is described, for example, in the following U.S. patent applications incorporated herein by reference: Ser. No. 08/706,104 filed Aug. 30, 1996 by A. Joffe et al.; Ser. No. 08/708,140 filed Aug. 27, 1996 by A. Joffe, now U.S. Pat. No. 5,842,025; and Ser. No. 08/845,710 filed Apr. 25, 1997 by A. Joffe et al. See also the following publications incorporated herein by reference: "ATMS2000 User's Guide (MMC Networks, Inc., issue 1.1); "ATMS2004B Switch Controller 2 'GRAY'" (MMC Networks, Inc., document 95-0004); "ATMS2003B Switch Controller 1 'WHITE'" (MMC Networks, Inc., document 95-0003); "ATMS2000 Application Note; Support For More Than 32K Connections" (MMC Networks, Inc., document 95-0009).

Figure 5:
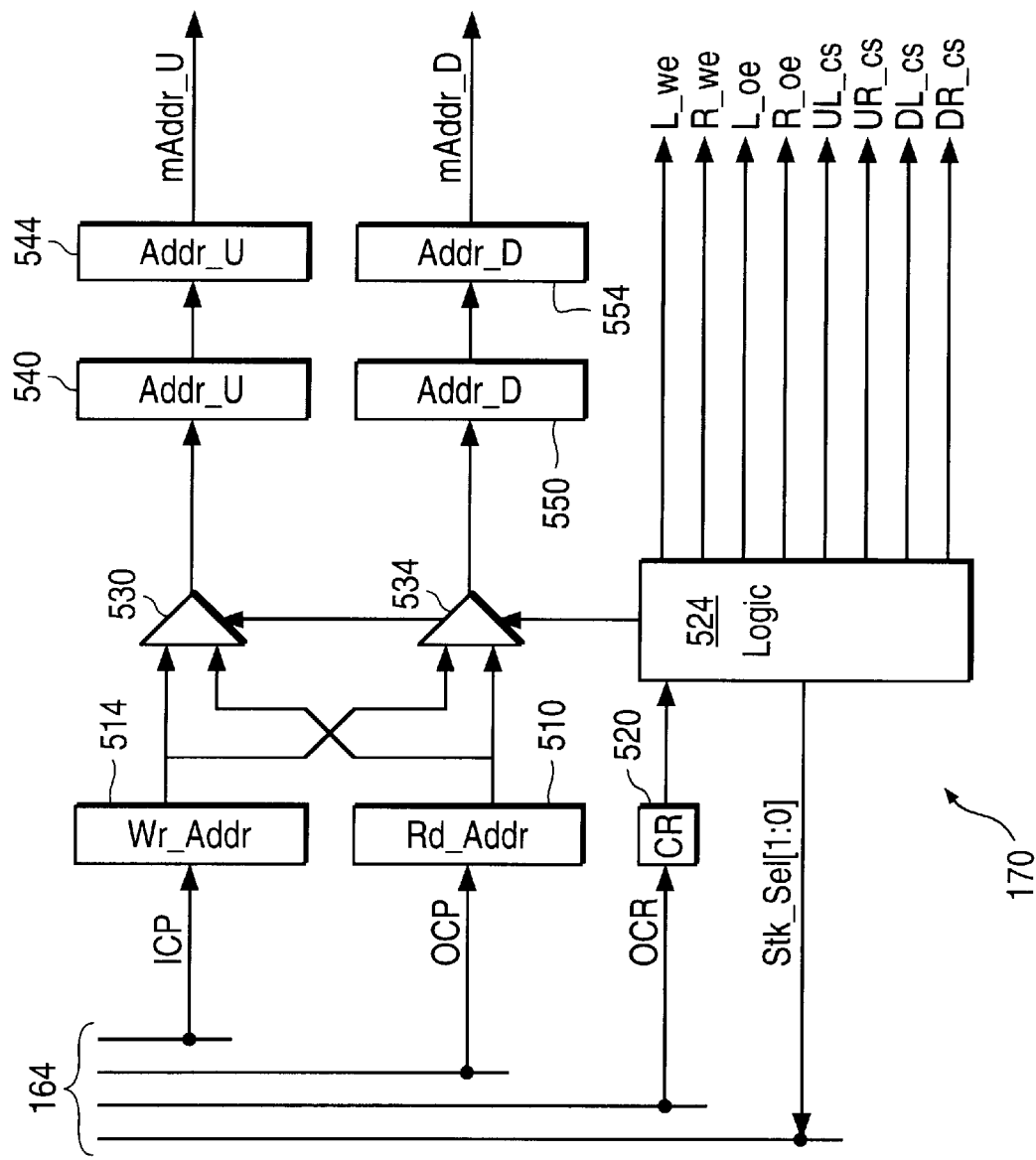
FIG. 5 is a circuit diagram of a memory address generation logic in some embodiments of FIG. 1.

Switch fabric control logic circuits 160.1, 160.2 are connected to control bus 164. Bus 164 is connected to address generation logic 170 (FIGS. 1, 5). Logic 170 generates address signals for memories 110 and provides the address signals to buses mAddr_U, mAddr_D. Logic 170 also generates memory control signals described below.

In FIG. 5, OCP (Output Cell Pointer) is the read address, i.e., the address of the cell to be read. ICP (Input Cell Pointer) is the write address. Internally, the switch fabrics 122 supplement each memory 110 address by two least significant bits (LSBS) identifying a particular memory 110. Thus, in some embodiments, each memory 110 uses 15-bit addresses, and each address bus mAddr_U, mAddr_D is 15 bits wide, but the switch fabrics extend the addresses internally to 17 bits. In read addresses, the two LSBs identifying the memory 110 are referred to as the Output Cell Region (OCR).

OCP and ICP do not include the two LSBs identifying the memory 110. Thus, each of OCP and ICP is as wide as memory bus mAddr_U or mAddr_D (15 bits in the above example).

ICP, OCP and OCR are provided to control bus 164 by switch fabric control logic circuits 160 as described below. OCP is latched in latch 510. ICP is latched in latch 514. OCR is latched in latch 520. The output of latch 520 is connected to the input of logic circuit 524. Logic 524 generates select signals for multiplexers 530, 534. The two data inputs of each multiplexer are connected to respective outputs of latches 510, 514. In any given clock cycle, one of the multiplexers selects ICP from latch 514, and the other multiplexer selects OCP from latch 510. The output of multiplexer 530 is connected to bus mAddr_U through serially connected latches 540, 544. The output of multiplexer 534 is connected to bus mAddr_D through serially connected latches 550, 554.

Logic 524 operates in accordance with the algorithm described above in connection with FIG. 4A.

Figure 6:
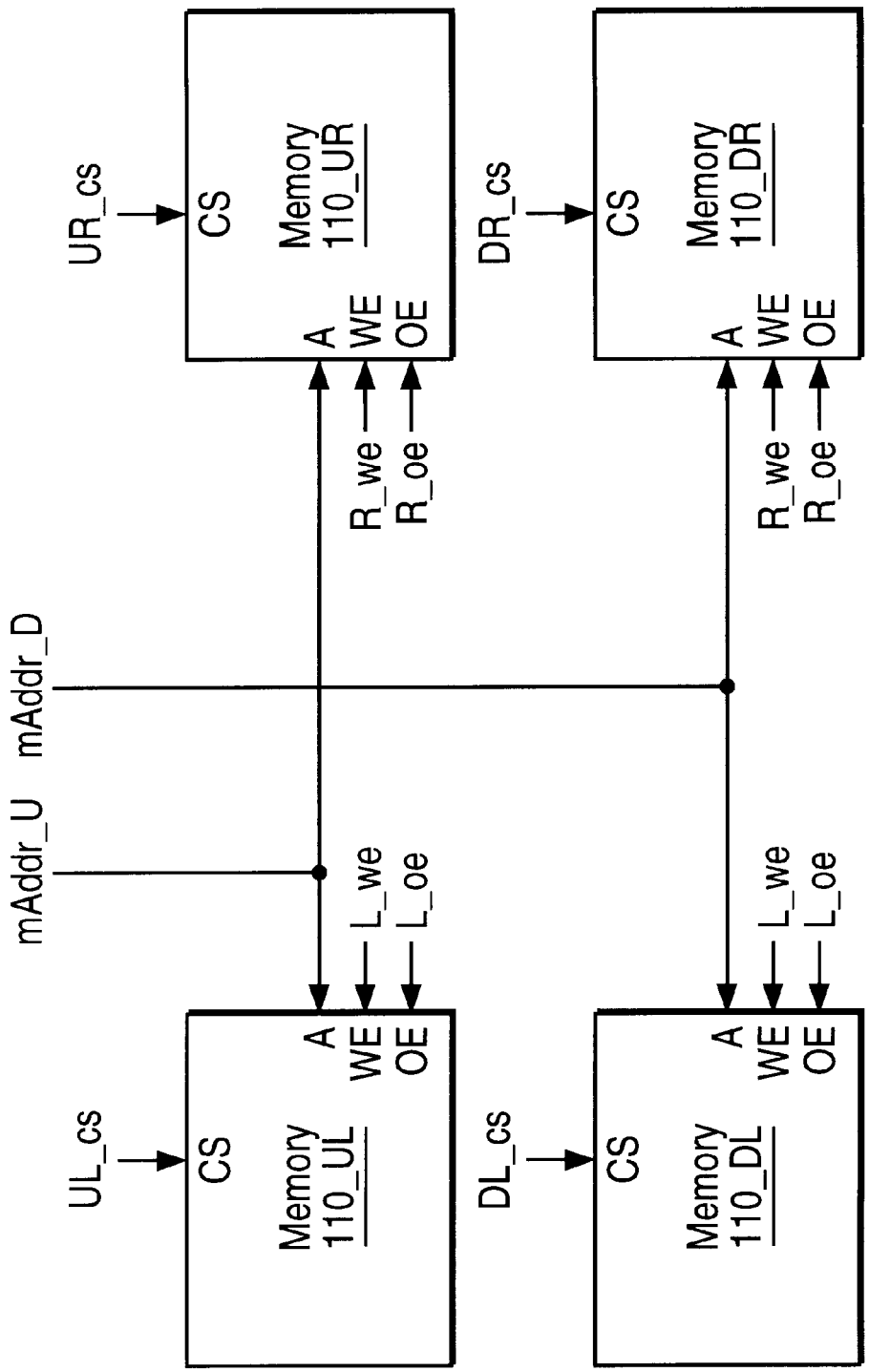
FIG. 6 is a block diagram showing some details of some embodiments of FIG. 1.

Logic 524 also generates the following signals:

1) write-enable signal L_we for memories 110_UL, 110_DL (FIG. 6);

2) write-enable signal R_we for memories 110_UR, 110_DR;

3) output-enable signal L_oe for memories 110_UL, 110_DL;

4) output-enable signal R_oe for memories 110_UR, 110_DR;

5) chip select signals UL_cs, UR_cs, DL_cs, DR_cs for respective memories 110_UL, 110_UR, 110_DL, 110_DR.

The timing diagram for these signals is illustrated in the FIG. 4B portion of FIG. 4. In FIG. 4B, "1" means the corresponding signal is asserted, and "0" means the signal is deasserted. (For example, in cycle 2, R_we is asserted and L_we is deasserted.) The embodiment being described uses memories in which for each memory access operation the chip select is asserted during the address phase of the operation, that is, during the clock cycle in which the address is provided to the memory. Similarly, the output enable signal is asserted during the address phrase of a read operation, and the write enable signal is asserted during the write operation.

Logic 524 also generates two-bit signal Stk_Sel[1:0] which identifies the memory 110 that is to be written in a subsequent write operation, as described in more detail below.

Figure 7:
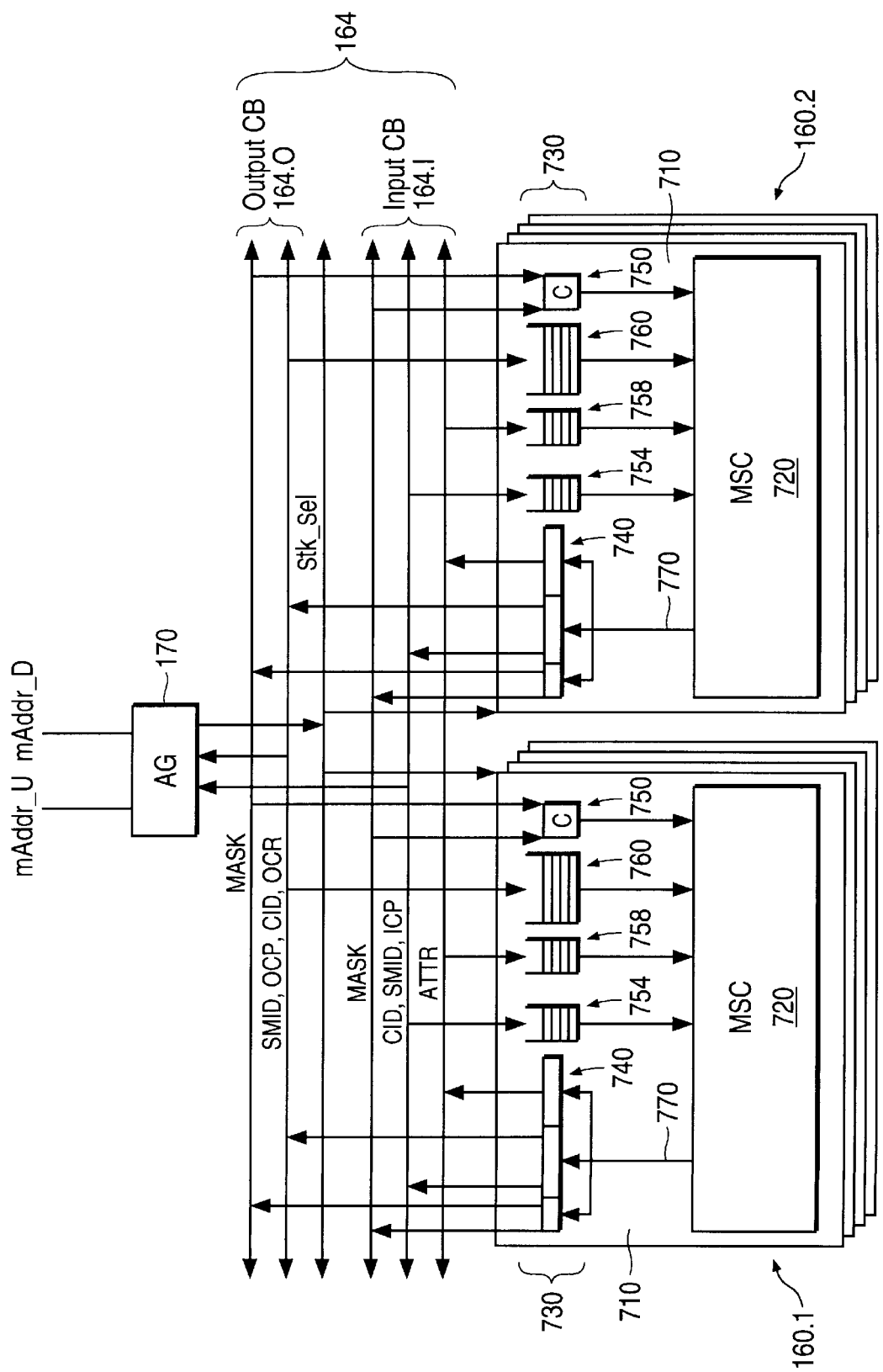
FIG. 7 is a block diagram of a portion of the ATM switch of some embodiments of FIG. 1.

FIG. 7 illustrates additional details of switch fabric control logic circuits 160.1, 160.2, control bus 164, and address generation logic 170.

Control bus 164 includes output control bus 164.O, input control bus 164.I, and a two-bit bus Stk_Sel connected to output Stk_Sel of logic 524 (FIG. 5).

Each fabric control logic 160.1, 160.2 includes four identical control blocks 710. Each control block 710 handles communication with eight of the ports 0–127 and with one of CPUs cpu0–cpu7. Thus, switch 118 is composed of eight switch fabrics, each of which is controlled by a respective control block 710. Each control block 710 has a modular switch controller (MSC) 720 connected to control bus 164 through control bus logic ("CBL") 730. Control bus logic 730 includes latches 740, 750 and queues 754, 758, 760. An output 770 of MSC 720 is connected through latches 740 to the following lines of output bus 164.O: MASK, SMID (Source Module ID), OCP, CID (Connection ID), and OCR. The MASK lines (the MASK "bus") include 1 bit for each MSC 720. The bit is set when the data on the output control bus 164.O is to be read by the corresponding MSC 720.

Output 770 is also connected through latches 740 to the following lines of input bus 164.I: MASK, CID, SMID, ICP, and ATTR. ATTR is cell attributes. See "ATMS2004B Switch Controller 2 'GRAY'" cited above, pages 12–13.

Lines CID, SMID, ICP of input control bus 164.I are connected to the input of queue 754 whose output is connected to MSC 720. Bus ATTR is connected to the input of queue 758 whose output is connected to MSC 720. Lines SMID, OCP, CID, OCR of output control bus 164.O are connected to the input of queue 760 whose output is connected to MSC 720. The MASK lines of buses 164.O, 164.I are connected to inputs of latch 750 whose output is connected to MSC 720.

Bus Stk_Sel is connected to each MSC 720 through respective CBL 730.

Lines ICP, OCP, OCR of control bus 164 are connected to inputs of address generation logic 170 as shown in FIG. 5.

Figure 8:
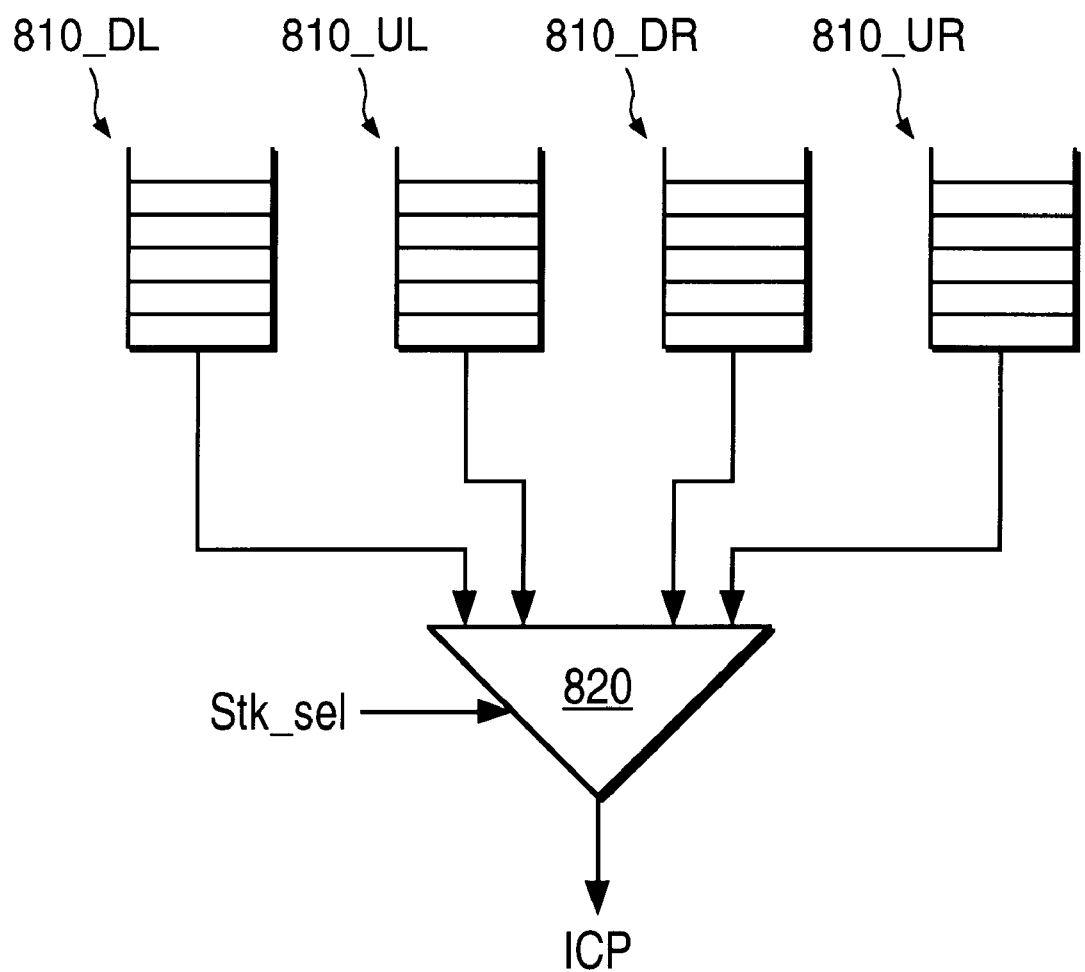
FIG. 8 is a block diagram of a circuit used in some embodiments of FIG. 1.
Figure 9:
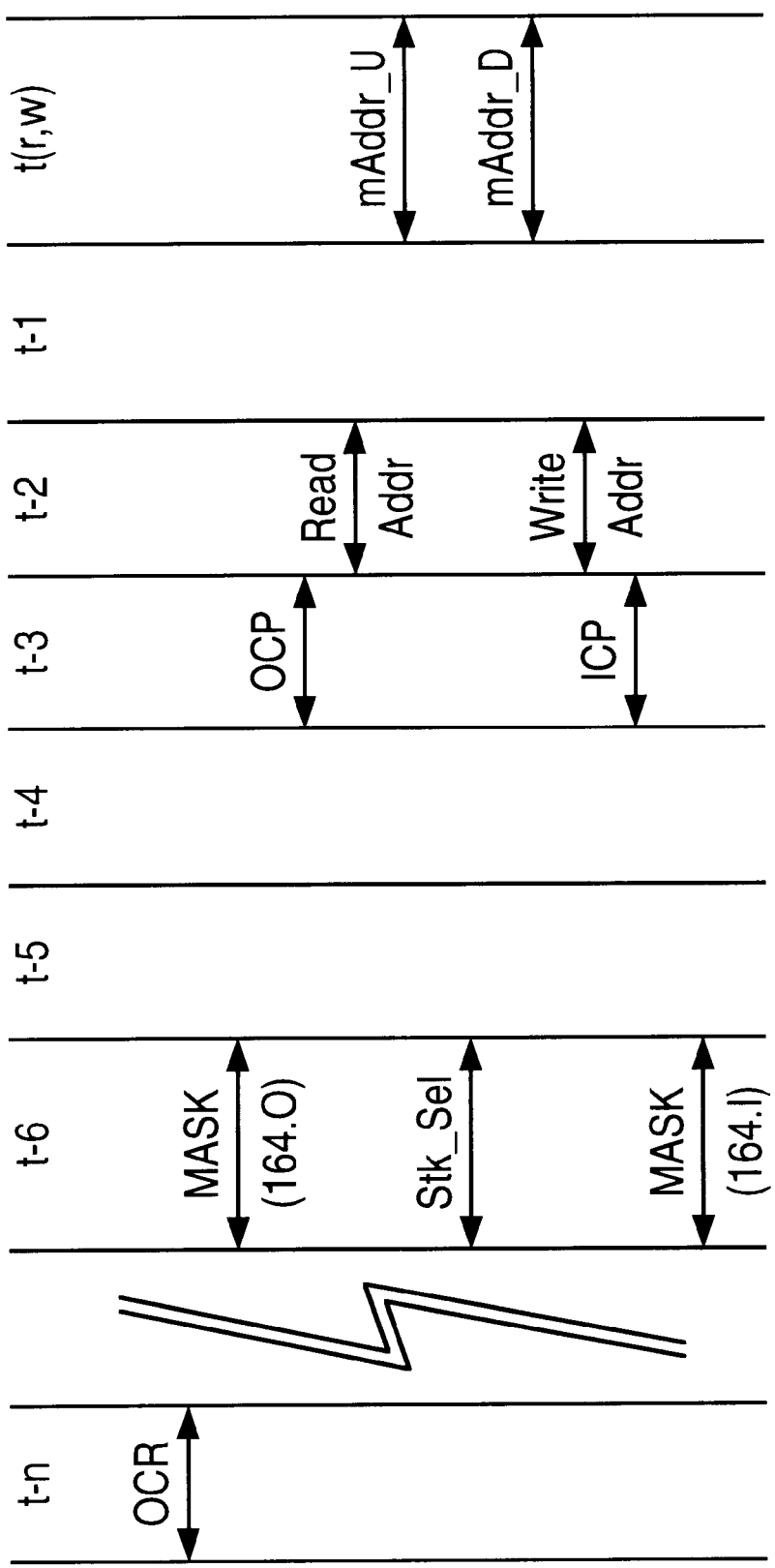
FIG. 9 is a timing diagram of an address generation pipeline used in some embodiments of FIG. 1.

As shown in FIG. 8, each MSC 720 stores four stacks 810_DL, 810_UL, 810_DR, 810_UR of 15-bit addresses (i.e. without the two LSBs identifying a memory 110) of all the free memory locations in respective memories 110_DL, 110_UL, 110_DR, 110_UR. Each memory location can store a single cell payload. In each clock cycle, the signal Stk_Sel causes multiplexers 820 of all the MSCs to select the stack corresponding to a memory 110 which will be written six cycles later. (As shown in FIG. 9, in clock cycle t–6 the Stk_Sel signal selects the memory that will be written in cycle t.) The pointer popped from the selected stack is ICP. ICP is provided from the outputs of multiplexers 820 to the ICP lines of input bus 164.I through CBLs 730 in cycle t–3 (FIG. 9). In an earlier cycle, the MSC 720 corresponding to the port or CPU whose cell will be written in cycle t provides a MASK signal identifying all the MSCs 720 corresponding to the ports and CPUs to which the cell is to be transmitted. The MASK signal is written to the MASK lines of input bus 164.I through the respective latch 740 in cycle t–6.

When the cell has been transmitted to all the ports and CPUs, a pointer to the cell payload in a respective memory 110 is returned to a respective stack 810 (FIG. 8) in all MSCs 720.

FIG. 9 illustrates the address generation pipeline. In clock cycle t, one of the address buses mAddr_U, mAddr_D is driven with a read address. The other one of the address buses is driven with a write address. Some "n" cycles earlier (where n>6), i.e. in cycle t–n, one of MSCs 720 provides, on the OCR bus, the OCR of the cell to be read in cycles t, t+1. In cycle t–6, address generation logic 170 generated the signal Stk_Sel identifying the memory 110 to be written in cycle t. Signal Stk_Sel is generated from the OCR signals driven on the OCR bus in cycles t–n and t–n–1. The OCR bus in cycle t–n identifies the memory that will receive a read address in cycle t. The OCR bus in cycle t–n–1 identifies the memory that will receive a read address in cycle t–1, and, therefore, identifies the data bus taken by the read operation in cycle t. See FIG. 4.

Also in cycle t–6, the control block 710 which is to write a cell in cycle t to memories 110 drives the MASK lines of output bus 164.O with signals identifying all the MSCs 720 which are to transmit the cell. The control block 710 which is to read a cell in cycle t drives the MASK lines of input bus 164.I with a signal indicating whether the control block needs the cell to continue to be stored in the memory after the cell is read out. This information is used to determine if the cell memory can be freed.

In cycle t–3, the MSC 720 which is to read a cell starting in cycle t provides the cell address OCP on the OCP bus. The MSC 720 which is to write a cell in cycle t provides the cell address ICP on the ICP bus. In cycle t–2, the read and write addresses appear respectively on the outputs of latches 510, 514 (FIG. 5). In cycle t, the addresses appear on buses mAddr_U, mAddr_D.

Returning to FIG. 1, the memory buffers 130, the interconnect matrix 150, and the PIFs 140.1 and 140.2 are similar to those described in the aforementioned U.S. Pat. No. 5,440,523 and PCT Publication WO 97/06489.

In some embodiments, interconnect matrix 150 includes two interconnect matrices, one for ports 0–63 and one for ports 64–127. Memory buffers 130 include two sets of memory buffers, one set for ports 0–63 and one set for ports 64–127. The interconnect matrix and the memory buffer set that correspond to ports 0–63 are part of switch fabric 122.1. The other interconnect matrix and the other memory buffer set are part of switch fabric 122.2. In each clock cycle, one set of the memory buffers is connected to data bus Data_L and the other set of the memory buffers is connected to data bus Data_R.

Figure 10:
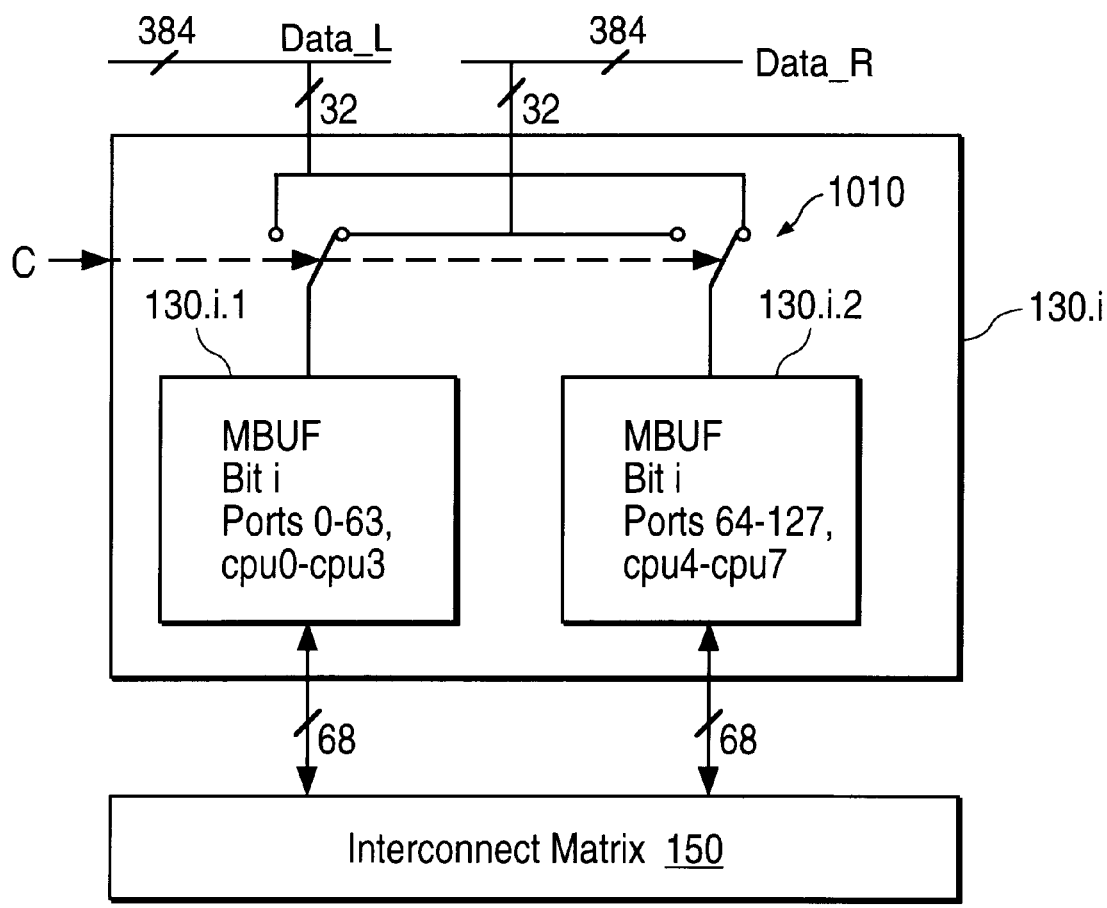
FIG. 10 is a block diagram of a circuit used in some embodiments of FIG. 1.

In other embodiments, a single interconnect matrix 150 and a single set of memory buffers 130 are shared by all the ports 0–127. Memory buffers 130 include 12 identical chips (i.e. integrated circuits) 130.1 through 130.12; see FIG. 10 showing a representative chip 130.$i$. A cell payload is transferred between memory buffers 130 and a PIF 140 in 12-bit words. See the aforementioned U.S. Pat. No. 5,440,523 and publication WO 97/06489. Each chip 130.$i$ stores the respective bits i of all 12-bit words of all cell payloads read to or written from memories 110. Each memory buffer chip 130.$i$ includes: (1) a memory buffer 130.$i$.1 for bits i of words transferred to and from ports 0–63 and CPUs cpu0–cpu3, and (2) a memory buffer 130.$i$.2 for bits i of words transferred to or from ports 64–127 and CPUs cpu4–cpu7.

Each buffer 130.$i$.1, 130.$i$.2 is connected to interconnect matrix 150 by 68 one-bit lines. For each port and each CPU, the respective buffer 130.$i$.1 or 130.$i$.2 has: (1) a register (not shown) to hold bits i of 32 consecutive words received from that port or CPU, and (2) a separate register (not shown) to hold 32 bits i of 32 consecutive words to be transmitted to that port or CPU. In any given clock cycle, switch 1010 in chip 130.$i$ connects one of buffers 130.$i$.1, 130.$i$.2 to data bus Data_R, and the other one of buffers 130.$i$.1, 130.$i$.2 to data bus Data_L. Each bus Data_R, Data_L is a 384-bit bus allowing a parallel transfer of a cell payload. (Of note, a cell payload includes exactly thirty-two 12-bit words, or 384 bits). All the switches 1010 of buffers 130.$i$ are controlled by the same signal C generated by address generator 170 (FIG. 1). In any given clock cycle, all the buffers 130.$i$.1, for all i, are connected to one and the same of buses Data_L, Data_R, and all the buffers 130.$i$.2 are connected to the other one of the buses Data_L, Data_R. Thus, one of switch fabrics 122.1, 122.2 uses one of the data buses, and the other switch fabric uses the other data bus.

Figure 11:
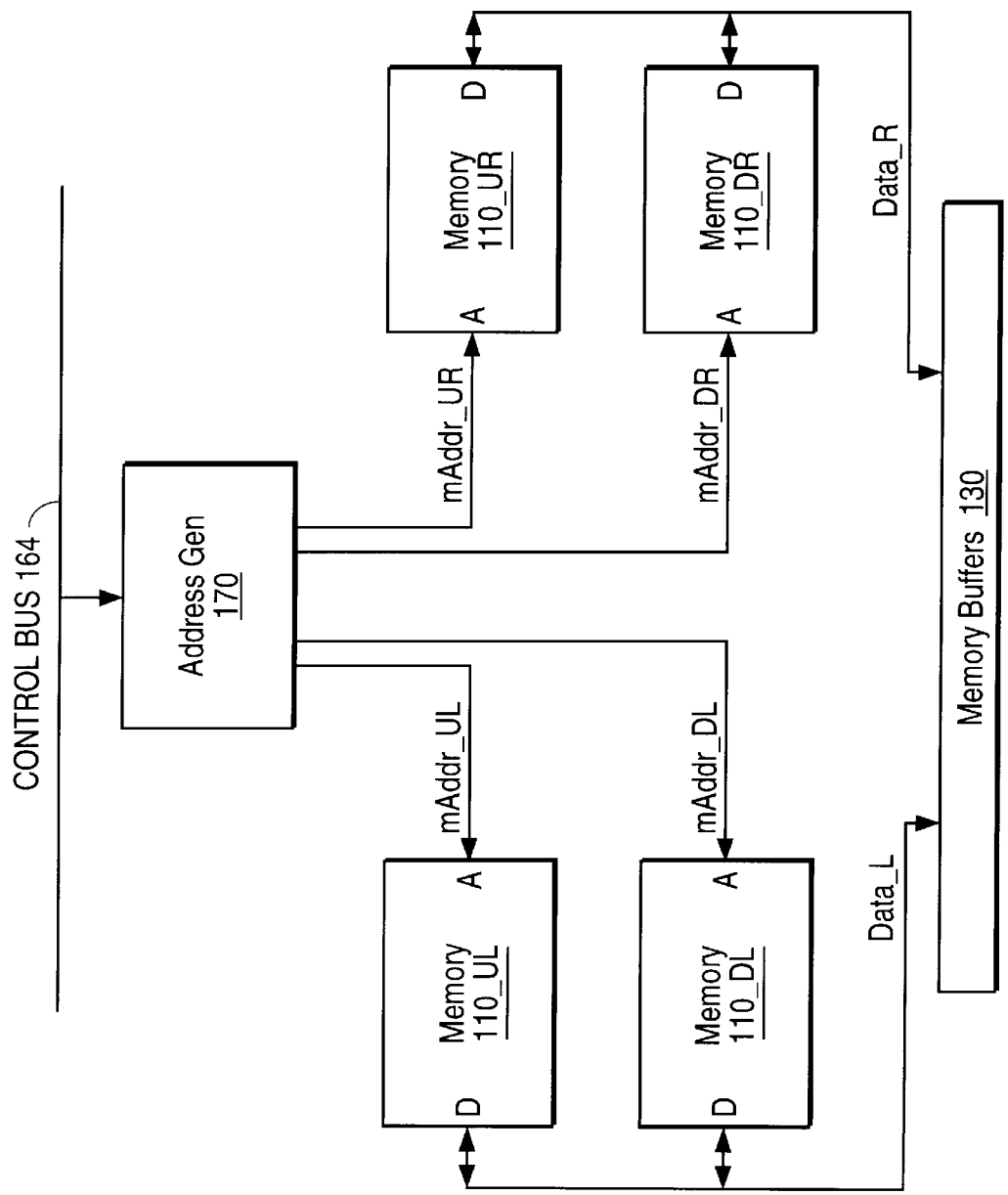
FIG. 11 is a block diagram of a portion of an ATM switch according to the present invention.

FIG. 11 illustrates an alternate embodiment having separate address buses mAddr_UL, mAddr_UR, mAddr_DL, mAddr_DR for respective memories 110_UL, 110_UR, 110_DL, 110_DR. In each clock cycle, address generation logic 170 generates the same address on buses mAddr_UL, mAddr_UR, and also generates the same address on buses mAddr_DL, mAddr_DR. The remaining features of the system of FIG. 11 are similar to those of FIG. 1.

The separate address buses allow the switch of FIG. 11 to operate in an alternate mode in which different addresses can be generated on buses mAddr_UL, mAddr_UR, and on buses mAddr_DL, mAddr_DR. In this mode, each memory 110 has half the size and half the bandwidth of the FIG. 1 mode, and hence the memory system is less expensive. In particular, each data bus Data_L, Data_R has half the width of the respective data bus of the system of FIG. 1. Further, in the alternate mode, the switch has only 64 ports and four CPUs, which further reduces the system cost.

Figure 12A:
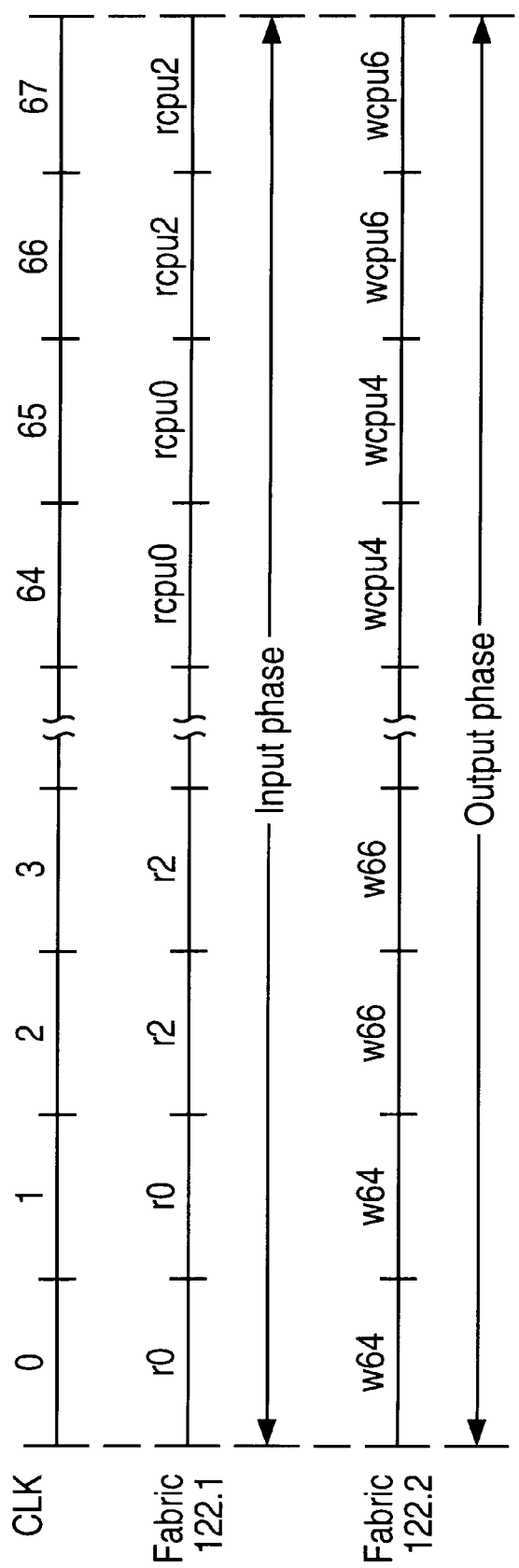
FIGS. 12A, 12B are timing diagrams for the switch of FIG. 11.
Figure 12B:
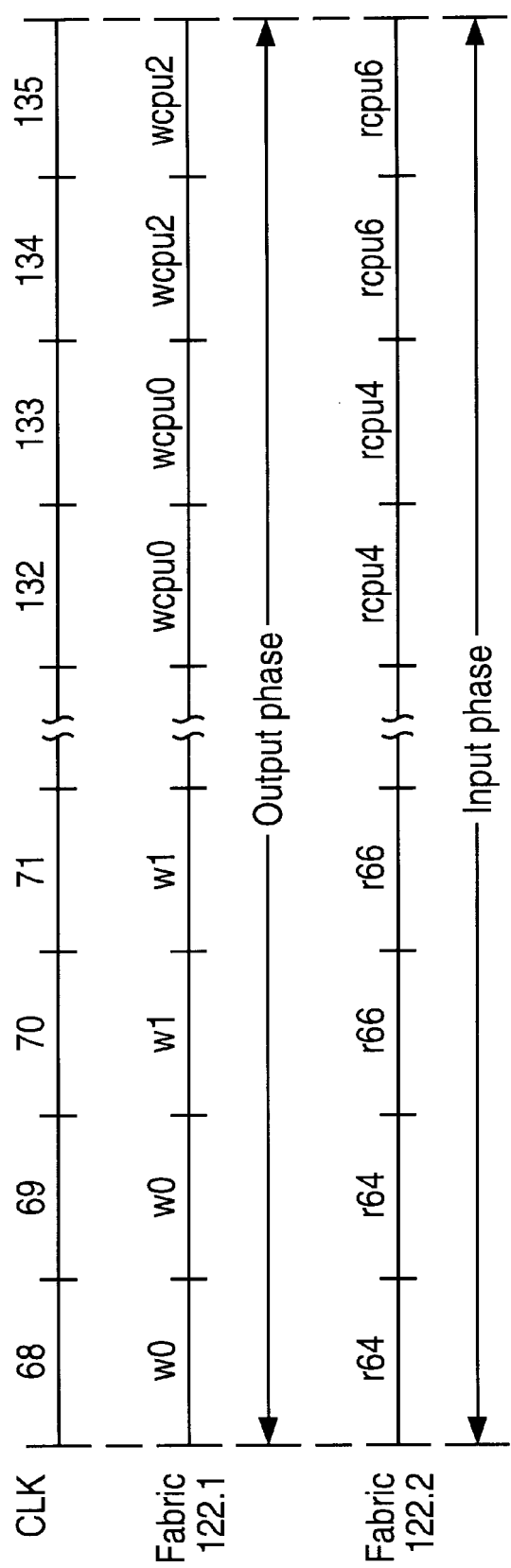

In the alternate mode, FIG. 2 still applies. Details of the input and output phases are illustrated in FIGS. 12A, 12B. An example is given in Table 1 below. The ports are numbered 0, 2, 4, . . . 126 (odd numbers are omitted), and the four CPUs are labeled cpu0, cpu2, cpu4, cpu6. A read or a write of a single cell takes two clock cycles, with one half of a cell payload being read or written in each clock cycle. Thus, in clock cycle 0 (FIG. 12A), fabric 122.1 (FIG. 1) reads from one of memories 110 one half of a cell payload to be transmitted on port 0, as indicated by "r0". Fabric 122.1 reads the other half from the same memory in clock cycle 1, as indicated by "r0". Both halves of each cell payload are stored in the same memory to simplify keeping track of where the cell is. In cycles 0 and 1, switch fabric 122.2 writes to another memory 110 respective halves of a cell payload received on port 64 ("w64"). Similarly, in clock cycles 2 and 3, respective halves of a cell payload are read out for port 2 ("r2"), and respective halves of a cell payload received on port 66 are written ("w66"), and so on. In clock cycles 64, 65, fabric 122.1 reads a cell payload for transmission to cpu0, and fabric 122.2 writes a cell payload received from cpu4. In clock cycles 66, 67, fabric 122.1 reads a cell payload for transmission to cpu2, and fabric 122.2 writes a cell payload received from cpu6.

In clock cycles 68–135, fabrics 122.1, 122.2 exchange places, with fabric 122.1 being in the output phase and fabric 122.2 being in the input phase.

In FIGS. 12A, 12B, "r" indicates a data phase of a read operation. Thus, in clock cycle 0, one half of a cell payload is provided on a data bus to fabric 122.1 in response to an address provided by logic 170 in the previous clock cycle. In clock cycle 1, the other half of the same cell payload is provided on the same data bus.

Table 1 below illustrates bus utilization in one example. In clock cycles 0, 1, read operation r0 reads memory 110_UL, taking the data bus Data_L. Data bus Data_R is available for the write operation w64. In cycle 0, the read r0 takes data bus mAddr_UL. In cycle 1, the next read operation r2 takes data bus mAddr_UR, to read data out of memory 110_UR in cycles 2 and 3. Therefore, address bus mAddr_DR is available for the write w64 in cycles 0 and 1.

TABLE 1

| CLK | 0 | 1 | 2 | 3 | 4 | 5 |
|---|---|---|---|---|---|---|
| mAddr_UL | r0 | | | | w68 | w68 |
| mAddr_UR | | r2 | r2 | | | |
| mAddr_DL | | | w66 | w66 | | r6 |
| mAddr_DR | w64 | w64 | | r4 | r4 | |
| Data_L | r0 | r0 | w66 | w66 | w68 | w68 |
| Data_R | w64 | w64 | r2 | r2 | r4 | r4 |

We can see that in any two cycles 2i, 2i+1 (i=0, 1, . . . , 67), at least one of the memories 110 is available for a write operation. Indeed, without loss of generality, suppose the read operation in cycles 2i, 2i+1 gets data from memory 110_UL. Since the read takes the data bus Data_L, the data bus Data_R is available for a write operation. The read takes bus mAddr_UL in cycle 2i, and the next read will take one of the four address buses in cycle 2i+1. Whichever address bus is taken, one of buses mAddr_UR, mAddr_DR remains available in cycle 2i+1 for a write. Since the same bus is available for a write in cycle 2i, at least one (and maybe both) of the memories 110_UR, 110_DR is available in both cycles 2i, 2i+1 for two write operations, allowing both halves of a cell payload to be written into that memory in parallel with the reads.

As illustrated in Table 1, there is no data bus utilization penalty. However, two address buses are unused in every clock cycle in this mode.

Figure 13:
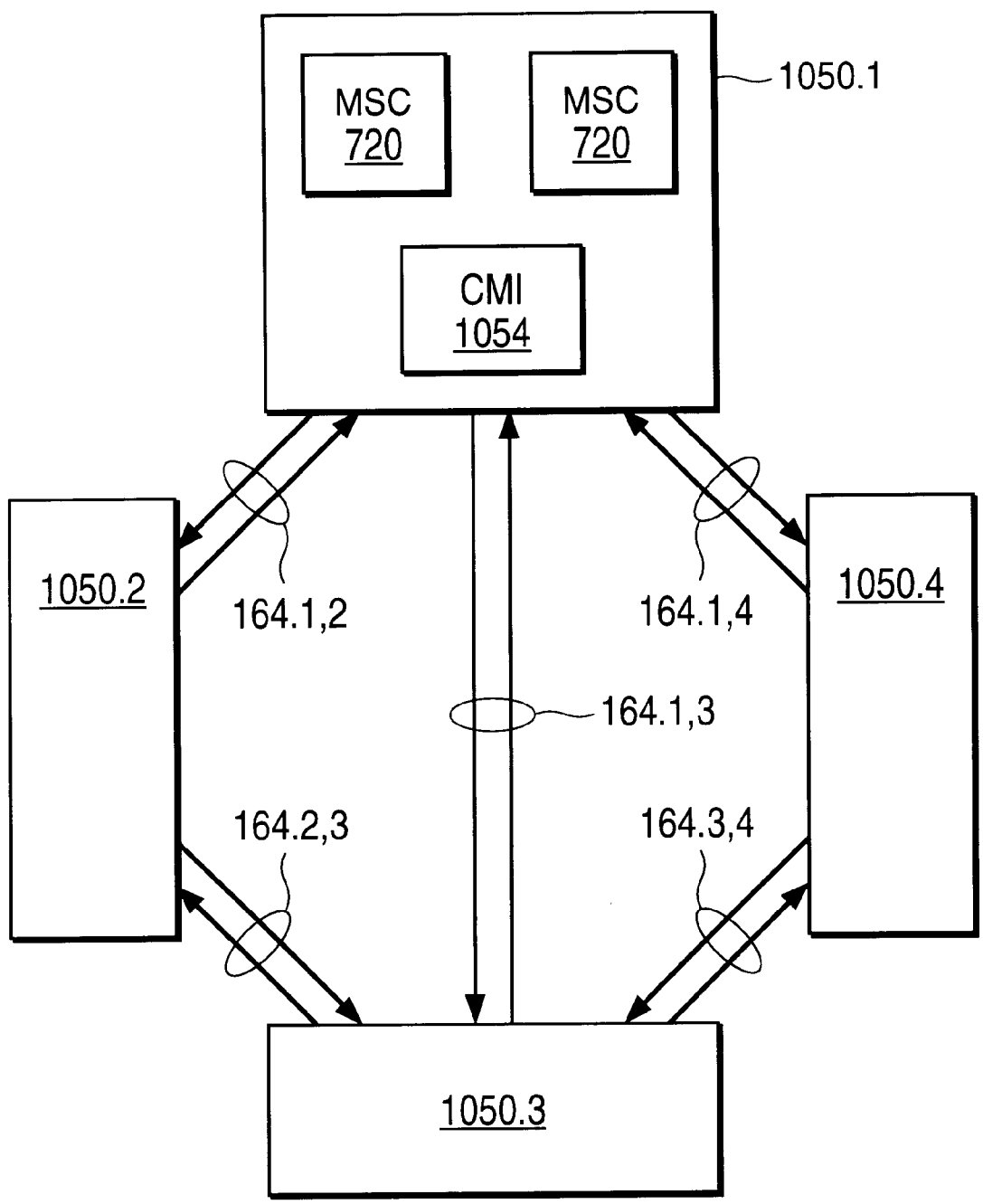
FIG. 13 is a block diagram of an ATM switch according to the present invention.

In FIG. 13, the shared bus 164 of FIG. 7 is replaced by dedicated connections to reduce signal transmission noise at high frequencies such as 50 MHz. FIG. 13 shows four cards (i.e., printed circuit boards) 1050.1, 1050.2, 1050.3, 1050.4. Each card 1050 includes two MSCs 720 and a control message interface ("CMI") integrated circuit 1054. The MSCs and the CMI circuit are shown in card 1050.1 only for simplicity. One embodiment of CMI 1054 is the part CMI-50A available from MMC Networks of Sunnyvale, Calif.

Bus 164 is replaced by dedicated connections 164.$i,j$ interconnecting respective cards 1050.$i$, 1050.$j$.

Figure 14:
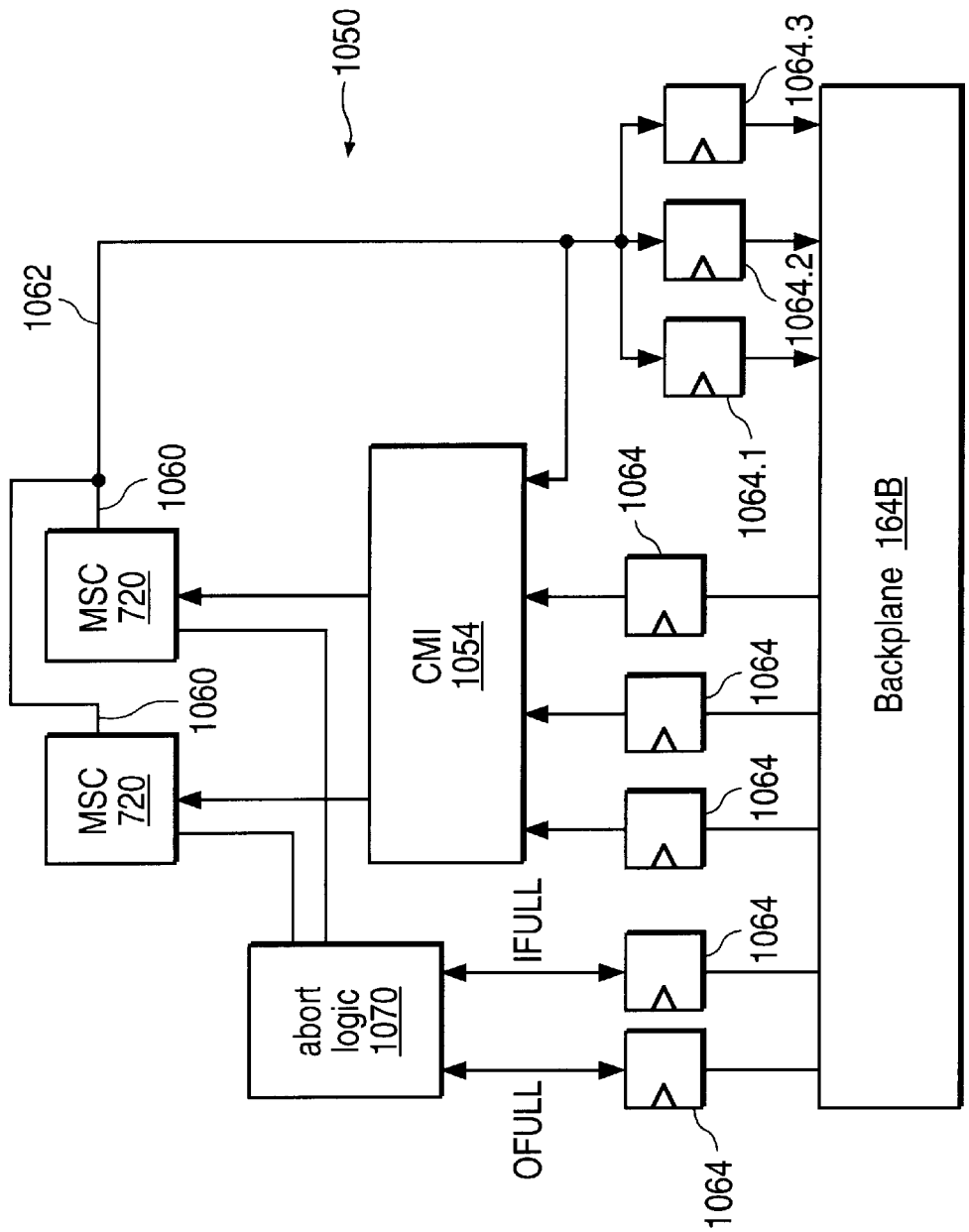
FIG. 14 is a block diagram showing details of the switch of FIG. 13.

FIG. 14 illustrates a single representative card 1050 in more detail. Outputs 1060 of the two MSCs 720 are connected to a bus 1062 shared by the two MSCs. Bus 1062 is connected to the inputs of latches 1064.1, 1064.2, 1064.3 whose outputs are connected to backplane 164B. Backplane 164B includes the lines 164.$i,j$ of FIG. 13. Each of latches 1064.1, 1064.2, 1064.3 provides an identical set of signals from bus 1062 to the backplane, which transmits the signals to respective three other cards 1050.

Bus 1062 is also connected to an input of CMI 1054 to allow the MSCs 720 to communicate with each other.

The backplane has lines connected to inputs of CMI 1054 through latches 1064. Outputs of CMI 1054 are connected to inputs of MSCs 720. These outputs perform the same function as the outputs of circuits 754, 758, 760, 750 of FIG. 7.

Abort logic 1070 has input/output ports connected to the two MSCs 720. Other input/output ports of abort logic 1070 are connected to backplane 164B through latches 1064 for transmission of the full signals OFULL, IFULL.

The signals going through backplane 164B are delayed by two levels of latches 1064 (one level on the source card 1050 and one level on the destination card). Therefore, CMI 1054 delays the signals received from bus 1062 of the same card (the loop-back signals) by two clock cycles.

In some embodiments, the circuitry of two cards 1050 (i.e., four MSCs 720 and two CMI circuits 1054) are combined on the same card. Other combinations are possible.

Figure 15:
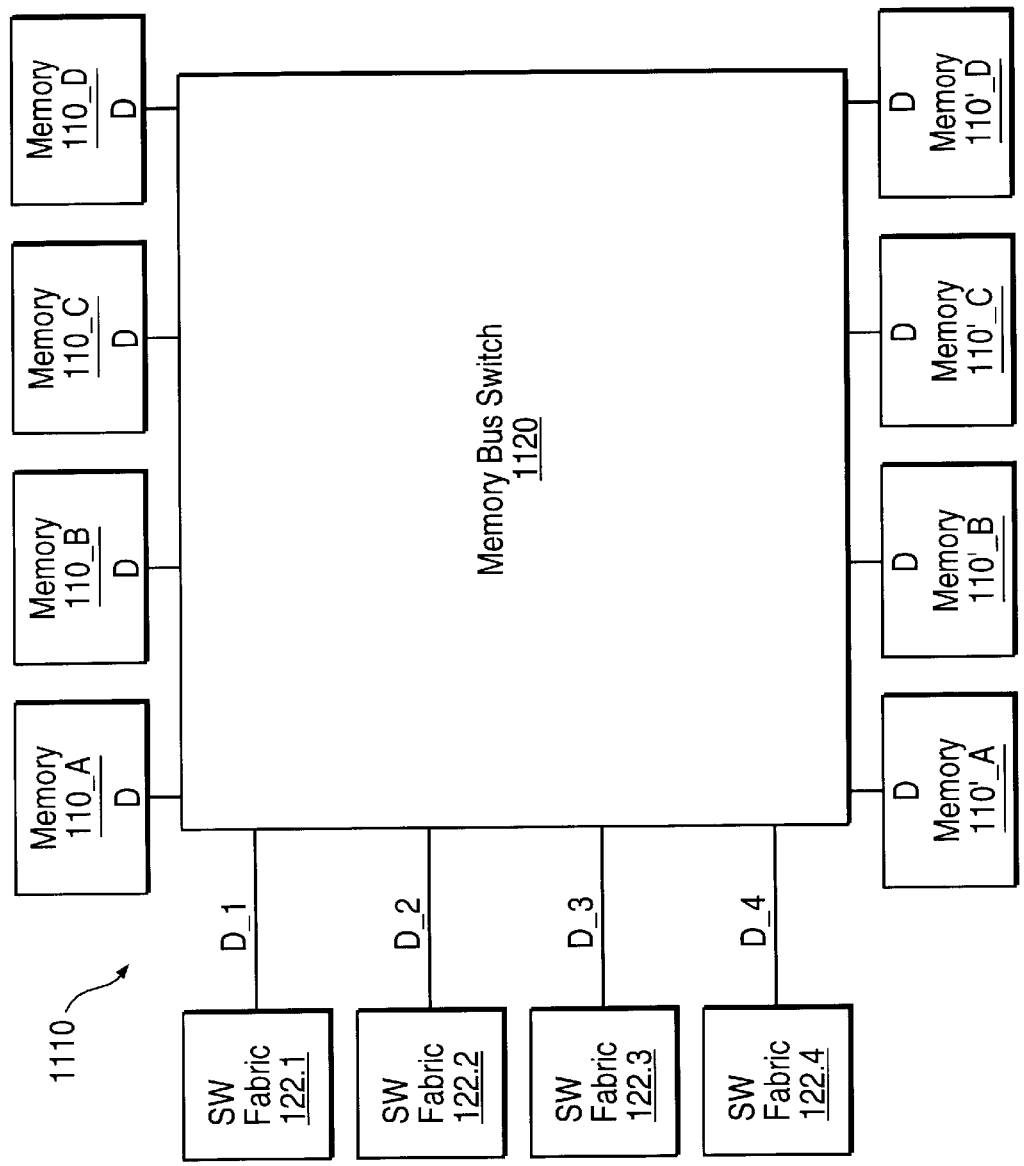
FIG. 15 is a block diagram of an ATM switch having a memory system according to the present invention.

FIG. 15 illustrates another memory system in a non-blocking ATM switch 1110. Switch 1110 is composed of four switch fabrics 122.1–122.4. Each switch fabric 122 controls a number of ports (not shown), for example, 64 ports, and includes one or more CPUs (not shown), for example, four CPUs. The switch fabrics 122 are interconnected by a control bus (not shown). Switch 1110 also includes an address generation logic, memory buffers, PIFs, and one or more interconnect matrices, which are not shown for simplicity.

In FIG. 15, individual memories 110__A, 110__B, 110C__, 110__D, 110'__A, 110'__B, 110'__C, 110'__D are asynchronous SRAMs in some embodiments.

Figure 16:
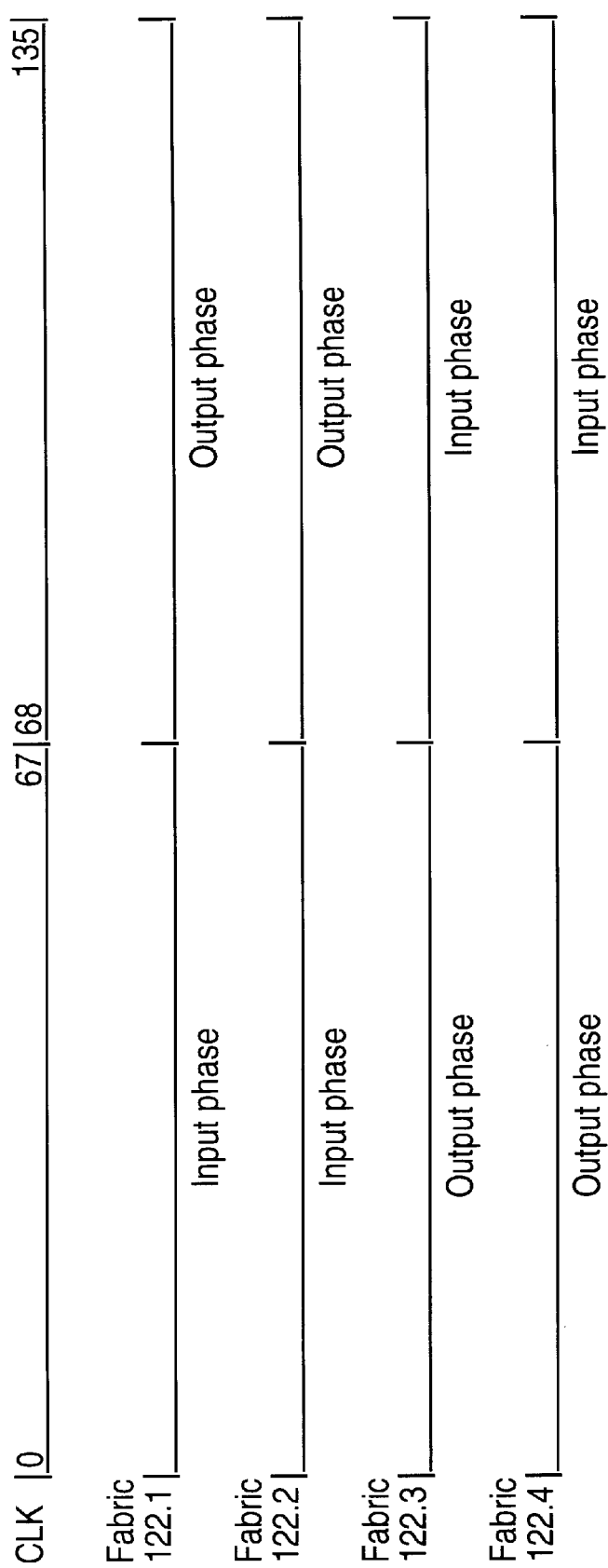
FIG. 16 is a timing diagram of a switch cycle in some embodiments of FIG. 15.

A switch cycle of switch 1110 is illustrated in FIG. 16. In clock cycles 0–67, switch fabrics 122.1, 122.2 are in the input phase, and fabrics 122.3, 122.4 are in the output phase. In clock cycles 68–135, fabrics 122.1, 122.2 are in the output phase, and fabrics 122.3 and 122.4 are in the input phase. In some embodiments, the input and output phases of each switch fabric are like those of FIG. 2.

The two switch fabrics that are in the input phase read memories 110 in every clock cycle. In any given clock cycle, the two input-phase fabrics may have to read data stored in the same memory. Therefore, in some embodiments, memories 110 are double-ported, or they are single ported but they are sufficiently fast to allow two read operations in a single clock cycle. However, in other embodiments, memories 110 are single-ported, and they are not sufficiently fast to allow two reads in a single clock cycle. Advantageously, these embodiments are less expensive. In these embodiments, each memory has a "mirror" image memory that contains the same data. Thus, memories 110__A, 110'__A are mirror images of each other, that is, they store the same data at any given time. Similarly, memories 110__B, 110'__B are mirror images of each other, memories 110__C, 110'__C are mirror images of each other, and memories 110__D and 110'__D are mirror images of each other. Hence, if two switch fabrics need data stored in the same memory in the same clock cycle, the two switch fabrics get the data from different memories that are mirror images of each other. For example, if switch fabrics 122.1, 122.2 both need data stored in memory 110__A, one of the two switch fabrics reads memory 110__A, and the other switch fabric reads memory 110'__A.

When any memory is written, its mirror-image memory is written with the same data at the same address. Thus, in one example, in one of clock cycles 68–135, switch fabric 122.3 writes a cell into each of memories 110__C, 110'__C at the same address for both memories, and switch fabric 122.4 writes another cell into each of memories 110__D, 110'__D at the same address for both memories. A double-ported memory is not needed for both memories.

Memory switch 1120 connects the data ports D of memories 110 to the data buses Data__1 through Data__4 of respective switch fabrics 122 as appropriate to accomplish the operation described above in connection with FIG. 16. Memory switch 1120 is controlled using methods known in the art. Address and control signals for memories 110 are generated using known methods.

Some embodiments combine the techniques of FIGS. 1 and 13. For example, some embodiments include 32 single-ported synchronous SRAMs. The 32 SRAMs are subdivided into two blocks of 16 SRAMs each. The two blocks are mirror images of each other. We will denote the memories of one block as M__i.j where each of i, j takes the values 1, 2, 3 and 4. We will denote the memories of the other block as M'__i.j, where i, j take the same values. For each given i and j, the memories M__i.j and M'__i.j are mirror images of each other.

For each memory block, four data buses and four address buses are provided. For each given j, data bus Data__j is connected to the data ports of memories M__1.j, M__2.j, M__3.j, M__4.j. For each given i, address bus mAddr__i is connected to the address inputs of memories M__i.1, M__i.2, M__i.3, M__i.4. Similarly, for each given j, data bus Data'__j is connected to the data ports of memories M'__i.j for all i, and address bus mAddr'__i is connected to the address inputs of all the memories M'__i.j for all j.

The memory system is used in a non-blocking switch, for example, a non-blocking ATM switch, including four switch fabrics. In any given clock cycle, two of the switch fabrics are in the input phase and two of the switch fabrics are in the output phase, as in FIG. 16. If data from the same memory are desired by different switch fabrics at the same time, the switch fabrics read mirror image memories, as in FIG. 15. In each clock cycle, two address buses are taken by the read operations started in the current clock cycle and two data buses are taken by the read operations started in the previous clock cycle. See FIG. 4. Therefore, in each clock cycle, at least two pairs of "mirror" address buses (mAddr__i1, mAddr'__i1), (mAddr__i2, mAddr'__i2), and at least two pairs of "mirror" data buses (Data__j1, Data'__j1), (Data__j2, Data'__j2) are available for write operations. One of the two switch fabrics in the output phase writes a cell into "mirror image" memories M__i1.j1, M'__i1.j1, at the same address for both memories, and the other one of the switch fabrics in the output cycle writes a cell into memories M__i2.j2, M'__i2.j2, at the same address for both memories. Therefore, two reads and two writes are performed every clock cycle.

The above embodiments do not limit the invention. In particular, the invention is not limited to any particular kind of memories or memory timing. Some embodiments use DRAMs or other kinds of memories. In some embodiments of FIG. 1, each read operation takes more than two clock cycles and each write operation takes more than one clock cycle. In some embodiments, the number of address buses equals the number of clock cycles taken by a read operation, and a new read address is supplied on each clock cycle. The invention is not limited to the number of memories used in the memory system. In some embodiments, the memories that are mirror images of each other store the same data at the same address. In other embodiments, the different memories use different addresses to store the same data. In some embodiments, each memory is an integrated circuit or a combination of integrated circuits. The invention is not limited to ATM. Some embodiments include synchronous transfer mode or any other data flow. Some embodiments include Ethernet, frame relay, and/or PPP/Sonet switches. In some such embodiments, a packet or a frame is subdivided into fixed size (e.g., 48 byte) cells; the last cell may be padded to reach the fixed size. The cells are stored in memory as described above. Then the cells are read out of memory as described above, reassembled to obtain the original frame or packet, and the packet or frame is transmitted. Other embodiments and variations are within the scope of the invention, as defined by the appended claims.

What is claimed is:

1. An apparatus comprising a control circuit for controlling access to a memory system, the memory system comprising:
   a plurality of memories each of which accepts addresses in read and write operations, wherein each memory allows read accesses to overlap so that providing data by the memory in one read access is allowed to overlap with providing an address to the memory in another read access;
   a plurality of address buses each of which is operable to carry an address to at least one of said memories; and
   N data buses, where N is an even integer greater than or equal to 2,
   wherein each of said data buses is operable to carry memory data to and from more than one of said memories but not to and from each one of said memories, and each of said memories is operable to be accessed via at least one of said data buses but not via each one of said data buses, and wherein the total number N of said data buses is less than the total number of said memories;
   wherein the control circuit comprises circuitry for allowing the memory system to perform any number of successive read operations immediately following one another and, at the same time, to perform successive write operations immediately following one another, wherein in each read operation any N/2 of said memories are allowed to be read via N/2 of said data buses, and wherein in each write operation N/2 of said memories are allowed to be written via N/2 of said data buses, and in a read operation, carrying read data on up to N/2 respective data buses is allowed to overlap with carrying read addresses for a subsequent read operation on the address buses, the control circuit being for receiving a first signal identifying, for each read operation, up to N/2 of said memories to be read in the read operation via N/2 of said data buses, the circuitry comprising:
      a first circuit for generating from the first signal, for each write operation, a second signal which identifies N/2 of said memories available for writing via N/2 of the data buses which are not taken by any read operation during a time needed to carry write data for the write operation; and
      a second circuit for generating, from the first signal, memory control signals for causing said memories to perform the read and write operations in accordance with the first and second signals.

2. The apparatus of claim 1 further comprising said memory system, wherein each memory is a synchronous SRAM.

3. The apparatus of claim 1 wherein any combination of any address bus and any data bus provides access to exactly one of said memories.

4. The apparatus of claim 1 further comprising a plurality of network switch fabric circuits operable to write, to the memories, data received from a network and also operable to read data from the memories when the data are to be transmitted to the network, wherein each switch fabric circuit is able to access the memories in parallel with all of the other switch fabric circuit(s), wherein the number of the switch fabric circuits is equal to the number of the data buses, wherein the switch fabric circuits comprise circuitry for generating the first signal.

5. The apparatus of claim 1 wherein the control circuit is timed by a clock signal which measures successive periods of time of equal length that immediately follow one another, such that in each period of time each memory is operable to receive a read address or a write address, wherein in a read access the memory receives a read address in one of said periods of time and provides data in another one of said periods of time, and in a write address the memory receives a write access and write data in one period of time;
   wherein the apparatus is operable, in each period of time to perform all of the following operations:
      (i) to provide N/2 read addresses to N/2 address buses in N/2 single-memory-read operations reading any N/2 of said memories,
      (ii) to receive N/2 read data items from N/2 data buses in N/2 single-memory-read operations which read any N/2 of said memories and which are different from the single-memory-read operations recited in (i),
      (iii) to provide N/2 write addresses to N/2 address buses other than the address buses recited in (i) and (ii), in N/2 single-memory-write operations, and
      (iv) to provide N/2 write data items to N/2 data buses in the N/2 single-memory-write operations recited in (iii).

6. The apparatus of claim 5 wherein each address bus is operable to carry an address to exactly N of said memories, each data bus is operable to carry memory data to and from exactly N of said memories, each memory is accessible via exactly one of said address buses and exactly one of said data buses, and any combination of an address bus and a data bus provides access to exactly one of said memories.

7. The apparatus of claim 5 wherein each data bus is operable to carry data to and from exactly N of said memories, each address bus is operable to carry addresses to exactly one of said memories, and each memory is accessible via exactly one of said address buses and exactly one of said data buses; and
   wherein the control circuit is operable to write data items to said memories such that each data item is written to a single one of said memories in two write operations with each write operation writing a portion of the data item, the two write operations immediately following one another, wherein each data item is to be read from a respective memory in two read operations immediately following one another, each read operation reading a portion of the data item.

8. The apparatus of claim 1 in combination with said memory system.

9. The apparatus of claim 1 wherein N=2.

10. An apparatus comprising a control circuit for controlling access to a memory system, the memory system comprising:
    one or more memories;

a plurality of address ports;

a plurality of data ports such that a combination of an address port and a corresponding one of the data ports provides access to the memory system;

a plurality of address buses connected to the address ports; and

N data buses connected to the data ports, wherein N is an even integer greater than or equal to 2, wherein each of said data buses is connected to more than one of said data ports but not to each one of said data ports, and each of said data ports is connected to one of said data buses, and the total number N of said data buses is less than the total number of said data ports;

the control circuit comprising circuitry for allowing the memory system to perform any number of successive read operations and, at the same time, to perform successive write operations, wherein the read and write operations are timed by a clock signal measuring successive periods of time of equal length that immediately follow one another, wherein in each read operation any N/2 of said data ports are allowed to be read via N/2 of said data buses and in each write operation N/2 of said data ports are allowed to be written via N/2 of said data buses, wherein in each of said periods of time except possibly when the first read operation is in progress, N/2 of the data buses are operable to carry data for a read operation and N/2 of the data buses are operable to carry data for a write operation, wherein in each read operation the read addresses are provided on the respective address buses starting in one of said periods of time but the read data are provided on the respective data buses starting in another, later, period of time, and in each write operation the write addresses and write data are provided on the respective address and data buses starting in one of said periods of time, and wherein each read operation except the last read operation is allowed to overlap with a later read operation such that in each read operation except the last read operation, carrying read data on the respective data buses is allowed to overlap with carrying read addresses for a later read operation on the address buses, the control circuit being for receiving a first signal identifying, for each read operation, up to N/2 combinations of said address and data ports to be used in the read operation via N/2 of said data buses, the circuitry comprising:

a first circuit for generating, from the first signal, a second signal which identifies, for each write operation, N/2 combinations of said address and data ports available for writing via N/2 of the data buses which are not taken by any read operation during a time needed to carry write data for the write operation; and a second circuit for generating, from the first signal, memory control signals for causing said memories to perform the read and write operations in accordance with the first and second signals.

11. The apparatus of claim 10 further comprising a plurality of network switch fabric circuits operable to write, to the memories, data received from a network and also operable to read data from the memories when the data are to be transmitted to the network, wherein the switch fabric circuits are able to access the memory system in parallel, wherein the number of the switch fabric circuits is equal to the number of the data buses, wherein the switch fabric circuits comprise circuitry for generating the first signal.

12. The apparatus of claim 10 wherein any combination of any address bus and any data bus provides access to the one or more memories.

13. The apparatus of claim 10 wherein the apparatus is operable, in each period of time except the first and last of said periods of time, to perform all of the following operations:

(i) to provide N/2 read addresses to N/2 address buses in N/2 single-memory-read operations reading any N/2 of said memories, (ii) to receive N/2 read data items from N/2 data buses in N/2 single-memory-read operations which read any N/2 of said memories and which are different from the single-memory-read operations recited in (i), (iii) to provide N/2 write addresses to N/2 address buses other than the address buses recited in (i) and (ii), in N/2 single-memory-write operations, and (iv) to provide N/2 write data items to N/2 data buses in the N/2 single-memory-write operations recited in (iii).

14. The apparatus of claim 10 wherein each address bus is operable to carry an address to exactly N of said address ports, each data bus is operable to carry memory data to and from exactly N of said data ports, each address port is accessible via exactly one of said address buses, each data port is accessible via exactly one of said data buses, and any combination of an address bus and the data bus provides access to said one or more memories.

15. The apparatus of claim 10 wherein each data bus is operable to carry data to and from exactly N of said data ports, each address bus is operable to carry addresses to exactly one of said address ports, and the control circuit is operable to write data items to the one or more memories such that each data item is written in two write operations with each write operation writing a portion of the data item, the two write operations immediately following one another, wherein each data item is to be read from the one or more memories in two read operations immediately following one another, with each read operation reading a portion of the data item.

16. The apparatus of claim 10 in combination with said memory system.

17. The apparatus of claim 10 wherein N=2.

18. A method for accessing a memory system comprising at least a first address port, a first data port, a second address port, a second data port, and an address bus which delivers each address signal placed on the address bus to both of the first and second address ports, the method comprising:

(1) in a read access through the first address and data ports, providing a read address signal to said address bus, the address bus delivering the read address signal to both of the first and second address ports;

(2) in said read access, the first data port providing a read data signal, but the second data port providing no data in response to the read address signal; and (3) in parallel with at least a portion of the first data port providing the read data signal, in a write access through the second address port and the second data port, providing a write address signal to the address bus and a write data signal to the second data port, the address bus delivering the write address signal to the first and second address ports in parallel with at least a portion of the first data port providing the read data signal;

wherein the address bus is connected to the first and second address ports.

19. The method of claim 18 wherein the first address and data ports are address and data ports of a first memory, and the second address and data ports are address and data ports of a second memory.

20. A method for accessing a memory system, the memory system comprising:
one or more memories;
a plurality of address ports;
a plurality of data ports;
a plurality of address buses for carrying addresses to the address ports; and
a plurality of data buses for carrying data to and from the data ports, wherein each of said data buses is operable to carry data to and from more than one of said data ports but not to and from each one of said data ports, wherein the total number of said data buses is less than the total number of said data ports,
wherein any address port is accessible via one of said address buses, and every data port is accessible via one of said data buses, and
wherein any combination of any address bus and any data bus provides access to the one or more memories, but not any combination of an address port and a data port provides access to the one or more memories, and wherein for every combination of an address port and a data port which provides access to the one or more memories, not every memory location is accessible through the combination of the address port and the data port;
the method comprising:
providing a clock signal which measures successive periods of time of equal length that immediately follow one another;
for each period of time, determining zero or more of the address buses that are to carry read addresses in said period of time and zero or more of the data buses that are to carry read data in said period of time, wherein for each read operation the read address is carried by a respective address bus in one of the periods of time and the read data are carried by a respective data bus in a later one of said periods of time, wherein in each period of time at least one address bus and at least one data bus are not used for a read operation;
determining one or more address buses and one or more data buses not used to carry a read address and read data in said period of time, and providing at least one write address and respective write data to the memory system via one or more address and data buses not used to carry a read address and read data in said period of time if write data are available for writing to said memory system.

21. The method of claim 20 wherein determining zero or more of the address buses that are to carry read addresses in said period of time comprises receiving a read address signal and determining the zero or more of the address buses from the read address signals.

22. The method of claim 20 wherein each read operation reads a payload of an ATM cell in an ATM switch, and each write operation writes a payload of an ATM cell.

23. A method for accessing a memory system, the memory system comprising:
one or more memories;
a plurality of address ports;
a plurality of data ports;
a plurality of address buses for carrying addresses to the address ports; and
a plurality of data buses for carrying data to and from the data ports, wherein each of said data buses is operable to carry data to and from more than one of said data ports but not to and from each one of said data ports, such that the total number of said data buses is less than the total number of said data ports,
wherein any address port is accessible via one of said address buses, and every data port is accessible via one of said data buses; and
wherein not any combination of an address port and a data port provides access to the one or more memories, and wherein for every combination of an address port and a data port which provides access to the one or more memories, not every memory location is accessible through the combination of the address port and the data port;
the method comprising:
providing a clock signal which measures successive periods of time of equal length that immediately follow one another, wherein the memory system is operable to perform read operations in each of which a read address is carried by an address bus in one of said periods of time and read data are carried by a data bus in a later one said periods of time, and the memory system is operable to perform write operations in each of which a write address and write data are carried by a respective address bus and a respective data bus in one of said periods of time;
receiving data items to write to the memory system, wherein each data item is to be written in two write operations immediately following one another, with each write operation writing a portion of the data item;
determining, for each period of time, zero or more of the address buses that are to carry read addresses in said period of time and zero or more of the data buses that are to carry read data in said period of time, wherein in the read addresses and the read data are carried to perform read operations, wherein each data item is to be read in two read operations immediately following one another, with each read operation reading a portion of the data item, wherein in each period of time at least one address bus and at least one data bus are not used for any read operation;
for each two successive periods of time in which one or more data buses are to carry two portions of a single data item in respective two read operations, determining one or more address buses and one or more data buses not used to carry a read address and read data in said two periods of time, and performing at least two write operations in said two periods of time to write at least one data item to the memory system via one or more address and data buses not used to carry a read address and read data in said two periods of time if a data item is available for writing to said memory system.

24. The method of claim 23 wherein each period of time is a single cycle of said clock signal.

25. The method of claim 23 wherein the data are received from a network, temporarily stored in the memory system, and read out of the memory system for transmission over the network.

26. The method of claim 23 wherein each read operation reads one half of a payload of an ATM cell in an ATM switch, and each write operation writes one half of an ATM cell.

* * * * *